US008924001B2

(12) United States Patent
Morisawa et al.

(10) Patent No.: US 8,924,001 B2
(45) Date of Patent: Dec. 30, 2014

(54) ETCHING APPARATUS, CONTROL SIMULATOR, AND SEMICONDUCTOR DEVICE MANUFACTURING METHOD

(75) Inventors: Toshihiro Morisawa, Yokohama (JP); Daisuke Shiraishi, Hikari (JP); Satomi Inoue, Kudamatsu (JP); Akira Kagoshima, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 334 days.

(21) Appl. No.: 13/514,708

(22) PCT Filed: Dec. 3, 2010

(86) PCT No.: PCT/JP2010/071733
§ 371 (c)(1),
(2), (4) Date: Jun. 28, 2012

(87) PCT Pub. No.: WO2011/104970
PCT Pub. Date: Sep. 1, 2011

(65) Prior Publication Data
US 2012/0310403 A1  Dec. 6, 2012

(30) Foreign Application Priority Data
Feb. 26, 2010  (JP) .................................. 2010-041975

(51) Int. Cl.
G06F 19/00 (2011.01)
H01J 37/32 (2006.01)
(52) U.S. Cl.
CPC ..... H01J 37/32972 (2013.01); H01J 37/32935 (2013.01)
USPC ................................ 700/121; 216/60; 216/67
(58) Field of Classification Search
CPC ............ H05H 1/0037; H01J 37/32972; H01J 37/32935

USPC ....................................... 700/121; 216/60, 67
See application file for complete search history.

(56) References Cited

U.S. PATENT DOCUMENTS

| | | | | |
|---|---|---|---|---|
| 6,400,458 B1 * | 6/2002 | Howald | ........................ | 356/496 |
| 2004/0023403 A1 | 2/2004 | Tatsunari | | |
| 2004/0138773 A1 | 7/2004 | Tomoyasu | | |
| 2009/0120580 A1 | 5/2009 | Kagoshima et al. | | |
| 2011/0083808 A1 | 4/2011 | Kagoshima et al. | | |

FOREIGN PATENT DOCUMENTS

| | | |
|---|---|---|
| JP | 2002-9059 | 1/2002 |
| JP | 2003-17471 | 1/2003 |
| JP | 2003-158160 | 5/2003 |
| JP | 2004-207703 | 4/2004 |
| JP | 2011-82441 | 4/2011 |

* cited by examiner

*Primary Examiner* — Sean Shechtman
*Assistant Examiner* — Chad Rapp
(74) *Attorney, Agent, or Firm* — Antonelli, Terry, Stout & Kraus, LLP.

(57) ABSTRACT

Based on a model for determining optical emission intensity values Y at wavelengths from actuator values X of an etching apparatus, X is calculated from Y to achieve preferable Run-to-Run control over Y. A relation between X and Y is defined as a control model (matrix model C1, ratio-constraint model C2) based on an algebraical expression with ΔX as an input and ΔY as an output. In etching process control, ΔX (manipulated volume) is calculated from ΔY (controlled volume) using the control model, based on a non-control optical emission intensity value Y, to set X (S1) for the etching process, during which Y is monitored. Based on an actual value for Y, a non-control optical emission intensity value Y to be used in the next wafer etching process is calculated.

21 Claims, 21 Drawing Sheets

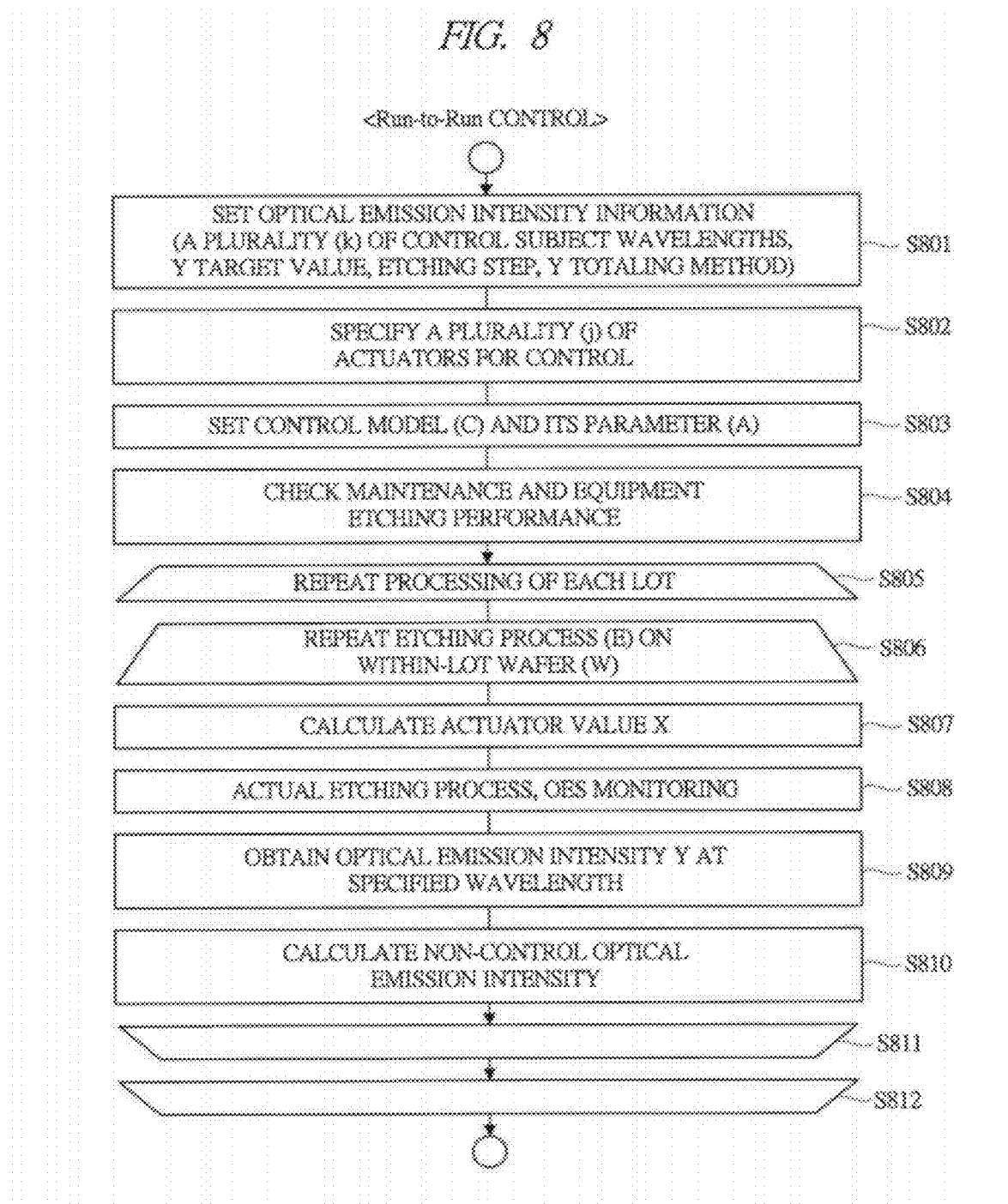

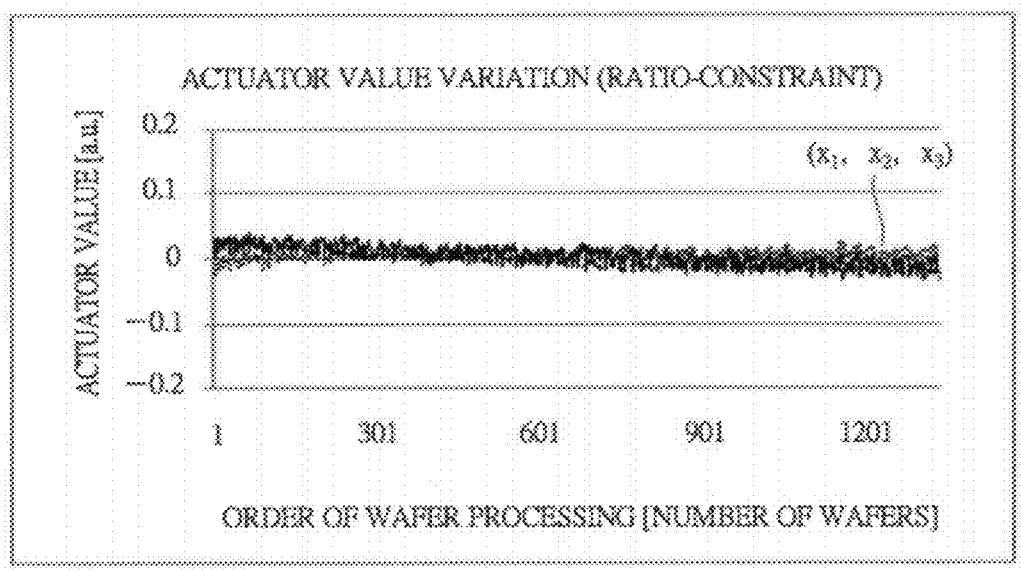

FIG. 14

| METHOD (CONTROL MODEL) | FEATURE | AIM | PARAMETER SETTING | ACTUATOR VALUE | OPTICAL EMISSION CONTROLLABILITY |
|---|---|---|---|---|---|
| MATRIX | CONTROL EACH OPTICAL EMISSION SEPARATELY WITH EACH ACTUATOR | TO ENABLE FINE ADJUSTMENT | MULTIPLE REGRESSION ANALYSIS | LARGE VARIATION (RISK OF RANK DEFICIENCY POSED) | FINE |
| RATIO-CONSTRAINT | DISTRIBUTE OPTICAL EMISSION CONTROLLED VOLUME AMONG ACTUATORS | CONTROL DIRECTED AT CHEMICAL REACTION | PLS REGRESSION ANALYSIS | SMALL VARIATION (SETTING FACILITATED) | NOT SO FINE |

[WITHOUT VARIATION]

[WITH VARIATION]

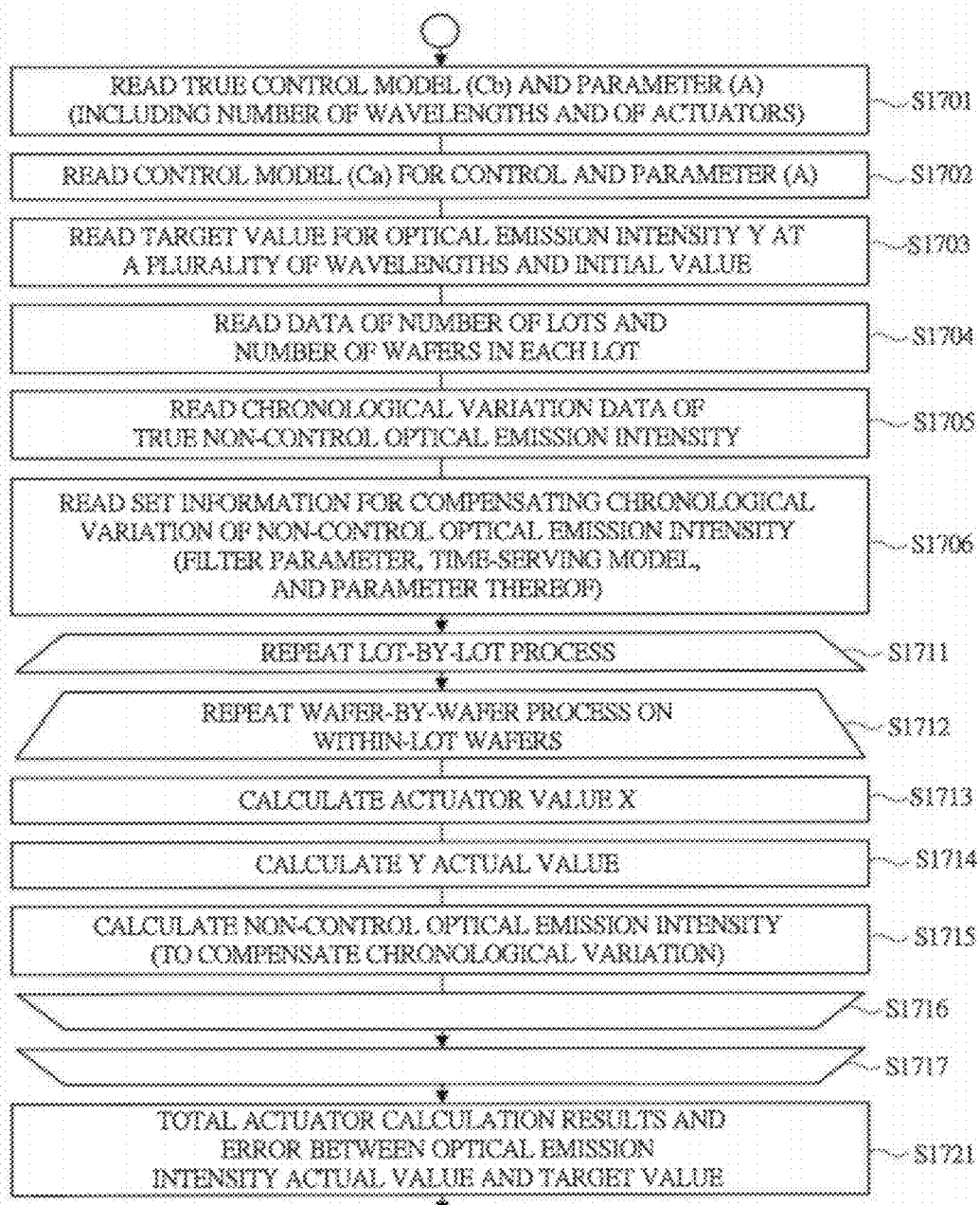

ETCHING APPARATUS, CONTROL SIMULATOR, AND SEMICONDUCTOR DEVICE MANUFACTURING METHOD

TECHNICAL FIELD

The present invention relates to techniques used in a semiconductor manufacturing technology, such as etching apparatus (etching process method), its control (etching control method), and its simulation.

The present invention relates particularly to APC (Advanced Process Control), which is a Run-to-Run process control method for an etching apparatus having an apparatus (OES, etc.) that monitors plasma optical emission, by which an etching process condition consisting of a plurality of actuator values for the next etching process is determined by referring to optical emission intensities at a plurality of wavelengths (optical emission wavelengths) on an optical emission spectrum during an etching process to obtain the target optical emission intensities at the plurality of wavelengths.

The present invention relates also to a method that applies to control using a control model representing the relation between a plurality of actuator vales and the optical emission intensities at a plurality of wavelengths, by which method the actuator values are determined in view of an error between an optical emission intensities target value and an actual value and of an actuator manipulated volume. The method includes a control simulation method for evaluating and verifying controllability for a case of changing various parameters for the control models.

BACKGROUND ART

[Etching] To form micropatterns, such as a semiconductor device, on a wafer, an etching process is carried out in such a way that a gas is ionized and dissociated using plasma to cause a dissociated substance to act on a wafer (react on the wafer surface) and remove a substance from the wafer. Ionized and dissociated substances vary and substances reacting therewith on the wafer also vary depending on product functions. To form a pattern on the wafer, the wafer is coated with a resist made of an organic-based substance and is subjected to photolithography to form a pattern on the wafer, then, the wafer is etched. To obtain a given pattern, a substance for adjusting reaction speed is introduced. In a chamber where the etching process is in progress, a variety of substances react with each other. It is described in Non-Patent Document 1 that etching performance, such as the size and selectivity of an etching rate, is determined depending on how various substance react with each other.

[OES] As ionization and dissociation caused by plasma accompanies optical emission phenomena, an etching apparatus that carries out plasma-utilized processing is equipped with an OES (Optical Emission Spectrometry) serving as an optical emission sensor to monitor the condition of a generation of plasma (Optical Emission Spectroscopy).

FIG. 1 illustrates optical emission data obtained by the OES (OES data mainly indicative of the relation between an optical emission spectrum and a waveform). An optical emission intensity spectrum distribution plotted on a graph with the horizontal axis representing time and the vertical axis representing wavelength is expressed as bit maps 101 to 103 (OES data bit maps). These bit maps graphically illustrate optical emission phenomena on a plurality of wafers (in the form of a light-and-shade scale of optical emission intensity). An optical emission intensity spectrum (optical emission spectrum) 111 at a certain time point indicates that the optical emission intensity is convex in a large area near the center of a monitored wavelength and that peaks appear at many wavelength positions. It is also observed that optical emission intensities along a process time sequence at specific wavelengths, that is, optical emission intensities during the etching process at wavelengths 121 and 122 change as the process goes on, and that, as indicated by a line a in the bit map 101, an optical emission phenomenon changes when the process contents is changed.

By monitoring such plasma-caused optical emission phenomena, etching process performance can be checked. For example, in high-volume manufacturing, optical emissions is monitored during consecutive processing of wafers to detect any abnormality. Optical emission data is also utilized as data for end-portion detection for determining a point of the end of the etching process. Optical emission monitoring is utilized because an optical emission at a specific wavelength is observed in correspondence to a specific substance in the chamber. For example, a carbon molecule $C_2$ emits light at wavelengths of 473.7 and 516.5 [nm], a silicon fluoride molecule SiF emits light at wavelengths of 334.6, 336.3, 436.8, 440.1, and 777.0 [nm], and a nitrogen molecule $N_2$ emits light at wavelengths of 282.0, 330.9, 405.9, 580.4, and 607.0 [nm]. The same molecule shows different optical omission wavelengths depending on its different energy states. Peaks appear on the optical emission spectrum 111, depending on such optical emission wavelengths.

[Optical emission intensity] Etching is a chemical reaction. A certain substance (molecular composition) turns into a different substance (molecular composition). Transformations like this accompany a highly correlated phenomenon.

FIG. 2 depicts the cause of the correlation between optical emission intensities based on a reaction (relation between chemical reactions and waveforms). At a first-order chemical reaction 201, a substance [A] is decomposed into a substance [B] and a substance [C] and the process of this reaction is defined by an equation 202 (first-order chemical reaction speed). At a second-order chemical reaction 203, two substances [A] (2[A]) bond together to form the substance [C], the process of which is defined by an equation 204 (second-order chemical reaction speed). At a high-order chemical reaction 205 in which a number of substances ([A]+ . . . ) bond to form the substance [C], the process is defined by an equation 206 (high-order chemical reaction speed). These reactions indicate that the relation between an increase and a decrease of substances can be explained by one substance in each reaction. For example, at a reaction 211 in which a [substance 1] turns into a [substance 2] and a [substance 3] (chemical reaction), the correlation between waveforms appears, as shown in a graph below (where the horizontal axis represents time and the vertical axis represents optical emission intensity), such that the [substance 2] and [substance 3] increase in response to a decrease in the [substance 1]. In other words, a proportional relation of optical emission intensities results.

In high-volume manufacturing of semiconductor device wafers, wafers are processed in lots repeatedly by a single etching apparatus. A lot is a unit for processing a group of wafers. One lot consists of several to scores of wafers, which are etched consecutively in each of chambers incorporated in the etching apparatus.

FIG. 3 is a graph of a time-serves variation of optical emission intensities (non-controlled optical emission intensities) at individual wavelengths for each wafer in a lot-wafer etching process. Figures on the horizontal axis represents lot units (plotted for each wafer), and the vertical axis represents optical emission intensities plotted against individual wavelengths. The optical emission intensity changes to rise and fall for each wafer in a lot. Optical emission intensity variation is also observed between different lots. The optical emission intensity reflects how a chemical reaction proceeds, and this chemical reaction determines etching performance. Optical emission intensity variation for each lot and wafer, therefore, means the variation of the etching performance. To stabilize the etching performance and obtain constant etching results at high repetitive precision, etching process conditions must be adjusted. Hence various actuators (a plurality of actuator values) related to the flow rates of various gases affecting reactions, current and voltage by high-frequency (RF) power, the internal pressure of chamber, etc., are adjusted.

Japanese Patent Application Laid-Open Publication No. 2003-17471 (Patent Document 1) discloses an apparatus and a process method which predict a process result based on output from a sensor that monitors a processing volume during a process and adjust/manipulate process conditions so that the process result comes to coincide with a target value. Patent Document 1 particularly describes adjustment/manipulation of a plurality of recipe parameters.

Japanese Patent Application Laid-Open Publication No. 2003-158160 (Patent Document 2) discloses a technique of quantifying the quality of a measured film based on an infrared absorption spectrum measured by an FT-IR method (Fourier-transform Infrared Spectroscopy) and adjusting a film-forming temperature. At this time, particularly, a PLS regression analysis (Partial Least Square Regression or Projection to Latent Structure Regression) which is configured to take in correlational change of substances such as a chemical reaction to perform a regression analysis is used.

Japanese Patent Application Laid-Open Publication No. 2004-207703 (Patent Document 3) discloses a technique of setting process conditions for a processing apparatus in correspondence to a process result that is a measurement taken after the end of the process. Patent Document 3 particularly describes a technique of predicting a process result from operation data of a processing apparatus, such as OES, including sensor data and using the PLS regression analysis for making such a prediction.

PRIOR ART DOCUMENTS

Patent Documents

Patent Document 1: Japanese Patent Application Laid-Open Publication No. 2003-17471
Patent Document 2: Japanese Patent Application Laid-Open Publication No. 2003-158160
Patent Document 3: Japanese Patent Application Laid-Open Publication No. 2004-207703

Non-Patent Document

Non-Patent Document 1: Michael A. Lieberman, Allan J. Lichtenberg, "Principles of Plasma Discharges and Materials Processing", Wiely Interscience

DISCLOSURE OF THE INVENTION

Problems to be Solved by the Invention

The present invention relates to Run-to-Run control adjusting actuator values (corresponding etching process conditions, recipes, etc.) for each wafer processing in an etching apparatus having a plurality of actuators for adjusting plasma optical emission and an apparatus that monitors plasma optical emission (OES, etc.). This Run-to-Run control has been devised to calculate a plurality of actuator values (manipulated volume, controlled volume), referring to the optical emission intensities at a plurality of wavelengths on an optical emission spectrum during an etching process, so that target optical emission intensities at the plurality of wavelengths are achieved at the next etching process. Because a given relation exists between a plurality of actuator values and etching process conditions, etc., the plurality of actuator values are subjected to the Run-to-Run control (control (adjustment) of the actuator values is equivalent to control (adjustment) of the etching process conditions, etc.).

In executing this control, to calculate an actuator value in correspondence to a wavelength optical emission intensity, a relation model (control model) modeling the relation between the optical emission intensities at a plurality of wavelengths and a plurality of actuator values must be defined first. To that end, etching is carried out with actuator values set different from each other, and parameters for the relation model is determined based on optical emission intensities resulting from that actuator value setting. Hence this relation model is provided as a model for calculating an optical emission intensity as output (denoted by Y) from an actuator value (denoted by X) as input (model C: Y=AX, where A denotes a parameter (coefficient/gain)). The model (C) is, therefore, provided on the assumption that the optical emission intensity (Y) is calculated from the actuator value (X). In execution of the control (etching control using the model), however, the model (C) is used to reversely calculate the actuator value (X) from the optical emission intensity (Y) (X=$A^{-1}$Y). The control is executed for a purpose of calculating a manipulated volume of an actuator set value (variation of X denoted as $\Delta X$) to reduce an error between an optical emission intensity actual value (variation of Y denoted as $\Delta Y$) and an optical emission intensity target value. The calculated value (set value) must be within a range (allowable range) that allows a value in the range to be actually set on the etching apparatus (actuator). In other words, the abnormality of the calculated actuator value (X) must be prevented (that is, variations of the calculated actuator value (X) must be limited in the allowable range).

Depending on the parameter (A) of the model (C), the control performance of the optical emission intensities (Y) at a plurality of wavelengths by adjusting a plurality of the actuator values (X) varies. These input/output variables (X, Y) and parameters (A) are taken in large numbers. For this reason, it has been generally difficult to make an experimental evaluation of control performance in high-volume manufacturing of semiconductor wafers.

Patent Documents 1 and 3 describe calculation of an actuator value from a target value for a test result. Such a test result includes an amount of trimming the gate of a CMOS element, a CD (Critical Dimension) value, a selectivity, a side etching volume, and a taper angle. The relation between these test results and an actuator is defined by a response surface model, according to which an actuator value is so determined that target test results are achieved. This means that actuator values are determined one by one based on a plurality of test results. Patent Documents 1 and 3 also describe prediction and estimation of a test result by, for example, the PLS regression analysis, using data obtained during the operation of an apparatus like OES.

Patent Document 2 describes estimating a film-forming temperature from an infrared absorption spectrum corresponding to a film quality in a film forming process and determining setting conditions for an apparatus, i.e., actuator values, in correspondence to the film-forming temperature.

According to these examples of prior art, the described techniques are limited to a method of determining an actuator value from sensor data made up of a plurality of pieces of data or a test result, and no method of calculating an actuator value from sensor data (optical emission intensity) using a model for determining sensor data (optical emission intensity) from an actuator value is indicated. In addition, a problem in using such a method and a solution to the problem are not indicated, either.

(1) A main preferred aim of the present invention is to provide a technique for calculating a plurality of actuator values (X) from the optical emission intensity values (Y) at a plurality of wavelengths based on the model (C) for calculating sensor date, i.e., the optical emission intensity values (Y) at the plurality of wavelengths, from the plurality of actuator values (X) and realizing preferable Run-to-Run control over the optical emission intensity (Y) (preferable etching process).

(2) Another preferred aim of the present invention is to enable control so that the abnormality of the calculated actuator value is prevented and an error to an optical emission intensity target value is reduced.

(3) Still another preferred aim of the present invention is to achieve a process method for determining the preferable parameter (A) so that the parameter (A) preferable to the control model (C) for the above control is determined based on an experiment (experimental work) to achieve preferable control based on the control model (C).

(4) The above control (X, Y multiple-input multiple-output (MIMO) control model) using a number of variables requires many parameters including the parameter (A), thus making control performance evaluation difficult. Still another preferred aim of the present invention is to solve this problem by using a control simulation to reduce difficulty in realizing actual work and a large burden and to achieve an efficient and easy evaluation.

Means for Solving the Problems

In order to achieve the above-mentioned preferred aims, representative means (embodiments) of the present invention are provided as follows.

An embodiment of the present invention is, for example, an etching apparatus which has an optical emission spectrometry (OES) for observing plasma optical emission (optical emission intensities at a plurality of wavelengths on an optical emission spectrum) in a chamber and a plurality of actuators for adjusting the plasma optical emission (through numerical value setting), and carries out a wafer etching process. The etching apparatus has a control function that is defined in the following manner. When the vales of the plurality of actuators are X and the values of optical emission intensities at the plurality of wavelengths are Y, the relation between set values (d1) for the plurality of actuator values X applied to the etching process by the etching apparatus and actual values (d2) for the optical emission intensity values Y at the plurality of wavelengths obtained by the OES during the etching process is defined as a control model (C) based on an algebraical expression (Y=AX) expressing the relation between a variation ΔX of the value X and a variation ΔY of the value Y with taking the variation ΔX as input and the variation ΔY as output. The value of a parameter (A) included in the control model (C) is set in advance, and a target value (d3) for the value Y is set in advance.

Control (Run-to-Run control) of the etching process includes a first process step (S1) at which before the start of the wafer etching process, values of differences (d5) between the target value (d3) for the value Y and a plurality of non-control optical emission intensity values (d4) are determined to be a target controlled volume (d6) for the value Y, and based on the control model (C), a controlled volume (d7) for the value X is calculated from the target controlled volume (d6) to apply the controlled volume (d7) as the set values (d1) to the plurality of actuators.

At a second process step (S2), the wafer etching process is started, and is ended as the optical emission intensity values (Y) at the plurality of wavelengths in the plasma optical emission are monitored at given time intervals by the optical emission spectrometry.

At a third step (S3), the actual values (d2) for the optical emission intensity values Y at the plurality of wavelengths based on data collected by the monitoring or obtained from the data under given time setting (e.g., the values Y at given time points or the total of the values Y within a given process time) are used to calculate the plurality of non-control optical emission intensity values (d4) to be used in the next wafer etching process, based on errors (d8) between the actual values (d2) for the values (Y) and the target value (d3) and on the controlled volume (d7) for the value X that is calculated at the first process step.

The process steps 1 to 3 are executed repeatedly in each wafer etching process (Run-to-Run control) to adjust the plurality of actuator values X and control the optical emission intensity values Y at the plurality of wavelengths.

[Run-to-Run control] The etching apparatus is equipped with the OES, which is connected to a memory means (DB, etc). The etching apparatus stores sensor data (OES data) monitored by the OES in the memory means on plasma optical emission during the etching process. To match optical emission intensities at a given plurality of wavelengths to a target value (or bring the optical emission intensities closer to the target value) in plasma optical emission, the etching apparatus includes means for setting and storing information of the plurality of wavelengths as control subject and the target value for the optical emission intensities at the given plurality of wavelengths.

The etching apparatus is configured to be capable of adjusting (setting) each actuator (value) so as to control optical emission intensities at a plurality of wavelengths by the values of a plurality of actuators incorporated in the etching apparatuses. The etching apparatus includes means for setting the manipulated (set) value for the plurality of actuators or instructing to set such a value, and means for setting an actuator used for control out of the plurality of actuators or instructing to set such an actuator and storing information of the setting or instruction in the memory means.

Calculating an actuator value (manipulated volume) from an optical emission intensity target value requires the control model (C) for determining the relation between the actuator value and the target value. Etching performance depends on the compositions of substances in the chamber and optical emission intensities at individual wavelengths change depending on such compositions. Etching performance is thus determined by actuator values, i.e., etching process conditions associated with the actuator values. An optical emission intensity can be controlled by a manipulated volume for an actuator value. The relation of an optical emission intensity (Y) to a manipulated value for an actuator value (X) is defined linearly by the following equation (1).

[Equation 1]

$$y = Ax \quad (1)$$

where X denotes a vector (variation) of the actuator value (X), Y denotes a vector (variation) of the optical emission intensity (Y), and A denotes a parameter matrix (coefficient matrix, gain matrix). Let $y^{TGT}$ denote a target value for the optical emission intensity (Y) (target optical emission intensity). The actuator value (X) to the target value $y^{TGT}$ is calculated by the following equation (2).

[Equation 2]

$$x = A^{-1} y^{TGT} \qquad (2)$$

To calculate the actuator value from the target optical emission intensity based on such a control model (which is given as a matrix expression and is, therefore, referred to as matrix control model (matrix model), etc., and can be rephrased as "simultaneous-equation-based model", etc.), the etching apparatus includes means for setting and storing a parameter (A) of the control model (C) given in the form of the above-mentioned matrix model. Because the control model (C) is not limited to the equation (1), the etching apparatus includes means for setting and storing definitions of various models.

The etching apparatus includes a function of calculating the actuator value (X) (manipulated volume) for achieving the target optical emission intensity based on the control model (C) before the start of the wafer etching process. The etching apparatus also includes a function of monitoring the optical emission intensity (Y) during the etching process by the OES and, based on the result of monitoring, compensating the irregularity of the optical emission intensity (Y) for each wafer and a time-serves variation of the optical emission intensity (Y) caused by repeated processing. Through this function, the etching apparatus determines an "optical emission intensity under no control" (non-control optical emission intensity) during the etching process, and calculates a manipulated volume for the actuator value (X) based on a difference between the non-control optical emission intensity and the target optical emission intensity.

[Experimental work] The etching apparatus includes various functions for carrying out experimental work for experimentally determining the parameter matrix (A) of the control model (C). This experimental work is carried out by applying a design of experiment to obtain a change in the optical emission intensities (Y) at a plurality of wavelengths corresponding to a change in a plurality of actuator values (X). Levels are set to the actuator values (X) and a different wafer is etched for each combination of levels of actuator values (X). The etching apparatus thus includes a function of setting (arraying) a combination of actuator value levels for each of wafers in a lot. The optical emission intensity (Y) during the etching process is stored in the memory means by the OES monitor. The etching apparatus thus has a function of determining (estimating) the parameter matrix (A) of the control model (C) with the actuator set value (X) (applied value) given as an input value and the optical emission intensity (Y) at each wavelength given as an output value. The etching apparatus usually processes wafers in lots. The etching apparatus thus includes a function of compensating a time-serves variation of the optical emission intensity (Y) when the optical emission intensity (Y) changes depending on time during the etching process of each of wafers in a lot.

[Control simulator] A control simulator (a given computer, program, etc., connected to or incorporated in the etching apparatus) is used, which achieves Run-to-Run control simulation for evaluating the result of control over a plurality of optical emission intensities (Y) corresponding to a set value for the parameter matrix (A) of the control model (C). The control simulator has a function of simulating a calculation carried out at actual control (actual etching process) by the etching apparatus. Specifically, the control simulator has means for setting and storing a target value for optical emission intensities (Y) at a plurality of wavelengths as control subject, the actuator value (X), the control model (C), and the parameter (A), and a function of simulating repeated etching process of wafers in a lot. The control simulator also has a function of calculating a manipulated volume for the actuator value (X) based on the control model (C) and a function of compensating the time-serves variation of the optical emission intensity (Y), the functions being used in the simulation. To obtain a simulation result equivalent to the result of the actual etching process, the control simulator has means for acquiring information of the time-serves variation or irregularity of the optical emission intensity (Y) during repeated etching processes, as input data or means of generating information of such time-serves variation or irregularity, and means for calculating an actual value for the optical emission intensity (Y) that results when the actuator value (X) is adjusted.

A problem that arises when the control model (C) is defined with the equation (1) will be described below. It should be noted that etching is a chemical reaction. For example, when a silicon (Si) substrate is etched using a flow rate of a fluorocarbon ($CF_2$) as an actuator, an increase in the flow rate results in an increase in $C_2$ and SiF that are reaction products. As a result, optical emission intensities at wavelengths caused by $C_2$ and SiF increase. Now a case is assumed where two actuators affect optical emission intensities at two wavelengths at a ratio of (1:2), based on which the following equation (3) is derived.

[Equation 3]

$$y = \begin{bmatrix} 1 & 2 \\ 2 & 4 \end{bmatrix} x \qquad (3)$$

Because the inverse matrix ($A^{-1}$) to the parameter matrix (A) of the equation (3) cannot be calculated, the actuator value (X) cannot be determined. Let a target value for two optical emission intensities (y: $y^A$, $y^B$) be $[y^A y^B]^T = [2\ 3]^T$ ($y^A$ etc. represent vectors). T affixed to the right shoulders of the vectors (matrix) denotes transposition. Let's assume control values for the optical emission intensities (ranges including the target value and defining the upper and lower limits thereto) be $[1.5 \le y^A \le 2.5]$ and $[2.5 \le y^B \le 3.5]$ and settable actuator values (X: $X_1$, $X_2$) be $[0 \le x_1 < 2]$ and $[0 \le x_2 \le 2]$. The following equation (4) is set as a model almost equivalent to the parameter matrix (A) of the equation (3).

[Equation 4]

$$A = \begin{bmatrix} 1.01 & 2 \\ 2 & 4.01 \end{bmatrix} \qquad (4)$$

With this model, determining the optical emission intensities target value in the equation (2) gives $[x_1\ x_2]^T = [40.32\ -19.36]^T$, an actuator value cannot be set on the etching apparatus. However, substituting $[x_1\ x_2] = [1.25\ 0.25]^T$ in the equation (3) gives $[y^A y^B]^T = [1.75\ 3.5]^T$, which does not match the target value but is within the control values. In the case of matrix-based modeling of the equation (1), a calculated actuator value based on the equation (2) turns out to be an extraordinary one but the optical emission intensity is identical with the target value.

To prevent calculation of an extraordinary (abnormal) actuator value that cannot be set (that is out of the allowable range) and reduce an error to the optical emission intensity target value, a control model which is not in the form of a simple matrix is introduced. Suppose that two actuators and two optical emission wavelengths are given. Two actuators are adjusted in such a way that one is adjusted by a magnitude of 1 and the other is adjusted by a magnitude of 2. In other words, the relation between both actuators in variation of their values X is determined to be a ratio $P=[1\ 2]^T$. It is also assumed that an optical emission intensity at one wavelength changes by 1, if an optical emission intensity at the other wavelength changes by 2. This means that the relation between both wavelengths in variation of optical emission intensities is determined to be a ratio $Q=[1\ 2]^T$. Now let the actuator be denoted by x, the optical emission intensity be denoted by y, and the relation between x and y be weighted with B=[5]. This yields the following equations (5) and (6) as control models (C).

[Equation 5]

$$y^T = x^T P(P^T P)^{-1} B Q^T = x^T \begin{bmatrix} 1 & 2 \\ 2 & 4 \end{bmatrix} \quad (5)$$

[Equation 6]

$$x^T = y^T Q(Q^T Q)^{-1} B^{-1} P^T = y^T \begin{bmatrix} 0.04 & 0.08 \\ 0.08 & 0.16 \end{bmatrix} \quad (6)$$

Here, the matrix for determining y from x shown above is the same as the transposition equation (3), and the matrix for determining x from y is defined as shown in the equation (6). These models are the models with a constraint condition of a ratio set between a plurality of actuator values (X) and optical emission intensity values (Y) at a plurality of wavelengths, and are, therefore, referred to as "ratio-constraint control model (ratio-constraint model)". Giving an optical emission intensity target value $[2\ 3]^T$ to the equation (6) yields $[x_1\ x_2]^T=[0.32\ 0.64]^T$, and substituting $[x_1\ x_2]^T=[0.32\ 0.64]^T$ in the equation (5) then gives $[y^A, y^B]^T=[1.6\ 3.2]^T$. This results shows that the control values for the optical emission intensity (Y) $[1.5 \le y^A \le 2.5]$ and $[2.5 \le y^B \le 3.5]$ and the settable actuator values (X) $[0 \le x_1 < 2]$ and $[0 \le x_2 \le 2]$ are satisfied. Because of the ratio constraint, the actuator values do not match the optical emission intensity target value.

An example of calculating the actuator value (X) using a matrix model (C1) with the equation (4) as the parameter matrix (A) and a ratio-constraint model (C2) of the equation (5) will be described. The optical emission intensity target value $[2\ 3]^T$ is divided into (distributed as) a first target value #1 $[1.98\ 2.97]^T$ and a second target value #2 $[0.02\ 0.03]^T$. Based on the ratio-constraint model (C2), a first actuator value #1 $[0.310\ 0.621]^T$ is derived from the first target value #1. Based on the matrix model (C1), a second actuator value #2 $[1.209\ -0.581]^T$ is derived from the second target value #2. Adding up these two actuator values #1 and #2 gives the actuator set value (X) $[1.520\ 0.040]^T$, which is within the allowable range for setting the actuator value (X).

Now the first actuator value and the second actuator value are substituted in the matrix model (C1) of the equation (4) and the ratio-constraint model (C2) of the equation (6), respectively, and resulting optical emission intensities are added up. This gives the optical emission intensity (Y) $[1.612\ 3.194]^T$, which is closer to the optical emission intensity target value than the optical emission intensity (Y) $[1.6\ 3.2]^T$ that is calculated using only the equation (6). In this manner, the calculated actuator value (X) is kept within the set allowable range and the optical emission intensity (Y) is brought closer to the target value.

In experimental work, the parameter (A) of the matrix model (C1) and the parameter (A) of the ratio-constraint model (C2) can be determined based on experimental results, using a multiple regression analysis and a PLS regression analysis, respectively.

The control model (C) is defined by an algebraical expression. A model for obtaining optical emission intensities (Y) at actually generated multiple wavelengths is defined as "true control model" (Cb), which is a model different from a control model (Ca) set for (applied to) actual control. Using this defined model, actuator values are repeatedly calculated as actual optical emission intensities are calculated. Thereby, Run-to-Run control simulation is achieved in the control simulator.

"Optical emission intensity under no control" (non-control optical emission intensity) refers to the optical emission intensity (Y) for a case of assuming no control over the optical emission intensity, which optical emission intensity (Y) is obtained by a calculation based on an actual value (monitoring value) for the optical emission intensity under actual control.

Effects of the Invention

According to the representative embodiments of the present invention, the following effects are provided. (1) Based on a model for calculating optical emission intensity values at a plurality of wavelengths from a plurality of actuator values, a plurality of actuator values are calculated from optical emission intensity values at a plurality of wavelengths and thus preferable Run-to-Run control over the optical emission intensity values (i.e., preferable etching process) can be achieved. (2) The control can be carried out so that an error to an optical emission intensity target value is reduced as the abnormality of the calculated actuator values is prevented at the same time. (3) A process method for determining a preferable parameter for the control model (C) for the above-described control can be achieved. (4) Use of the control simulation, difficulty in realizing actual work and a large burden are reduced and to achieve an efficient and easy evaluation.

BRIEF DESCRIPTIONS OF THE DRAWINGS

FIG. 8 depicts a process flow of the Run-to-Run control carried out by the etching apparatus, etc., of one embodiment of the present invention;

FIG. 13 depicts an example (2) of a result of the Run-to-Run control (actuator value);

FIG. 14 is a comparison table containing a list of features of two control models for the control (matrix model (C1) and ratio-constraint model (C2));

Figure 15A:
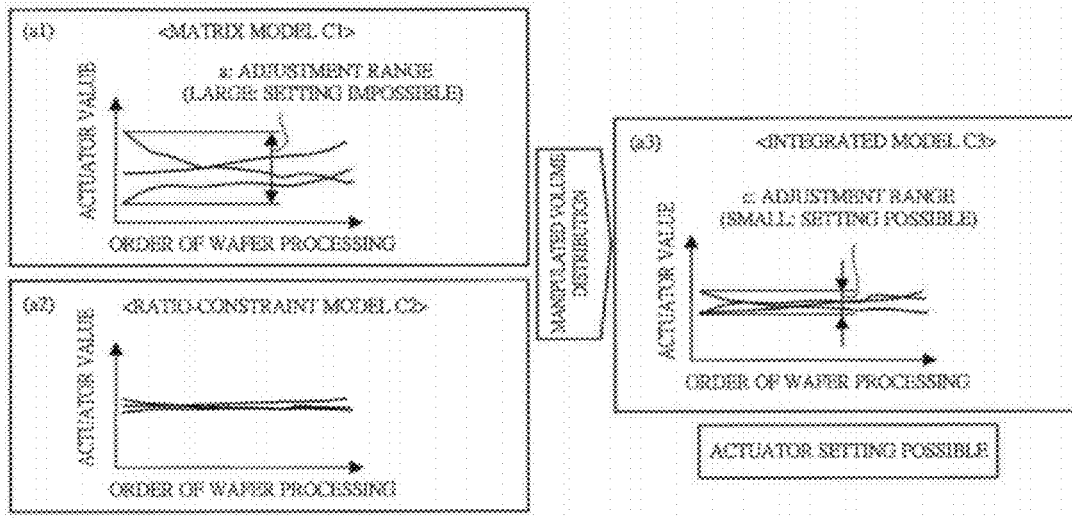
Figure 15B:
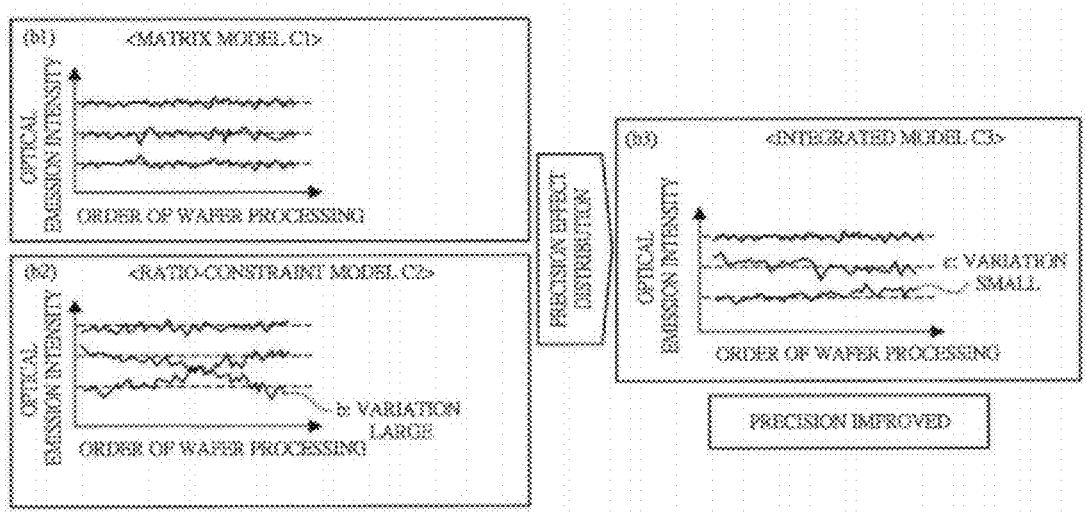
Figure 16:
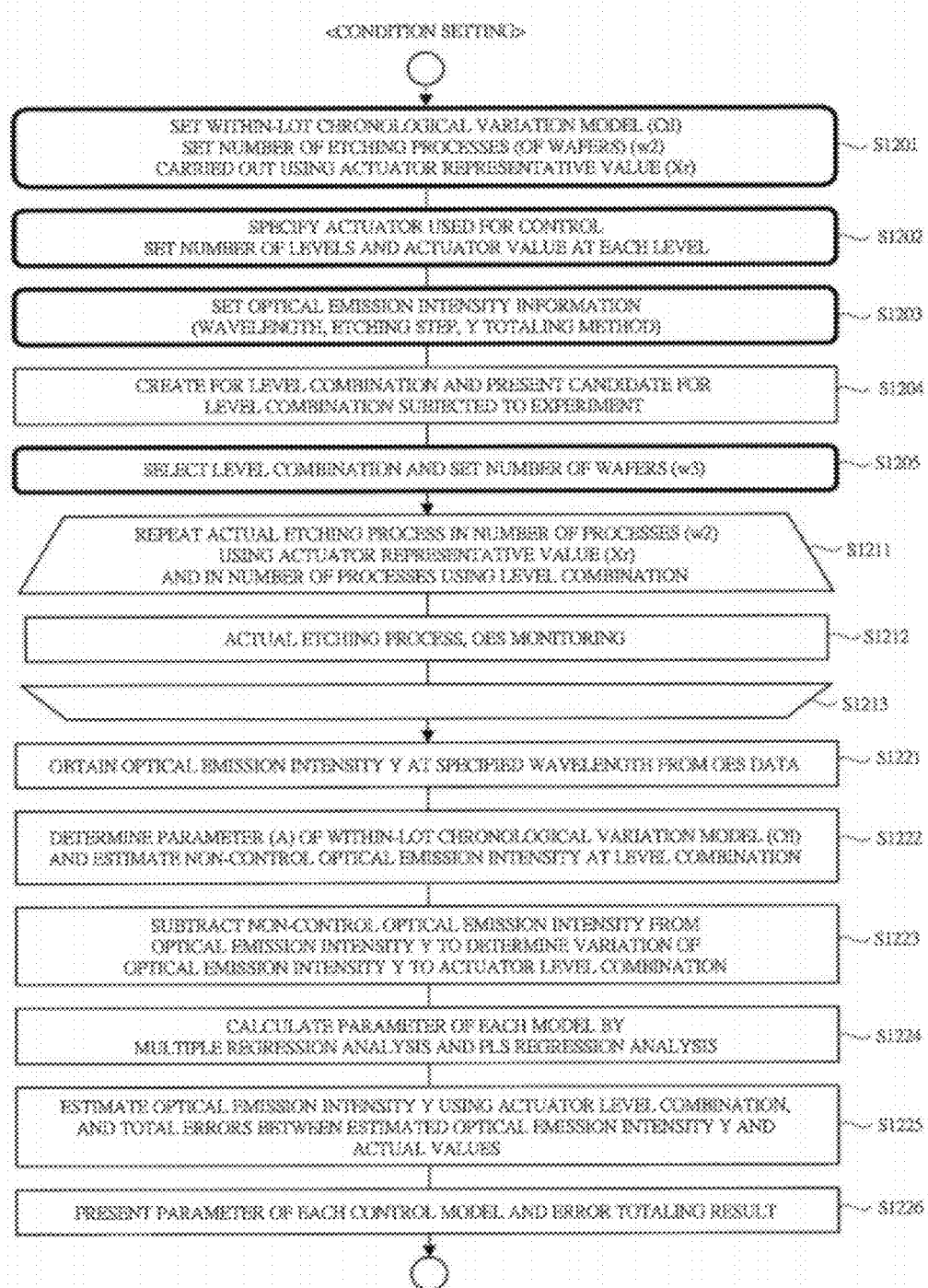
Figure 17:
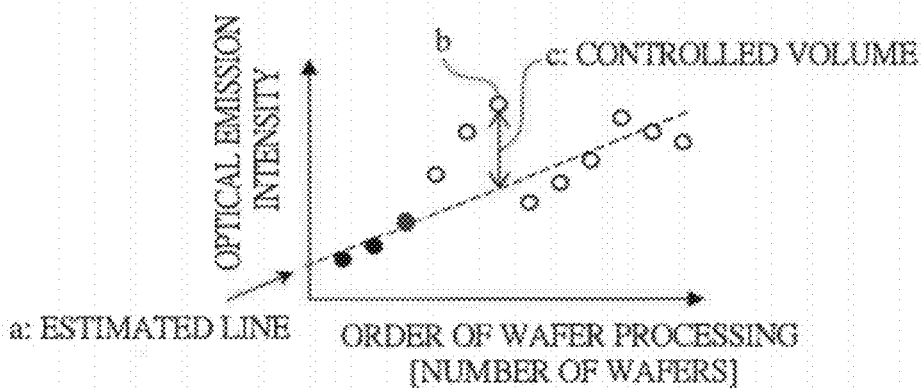
Figure 18:
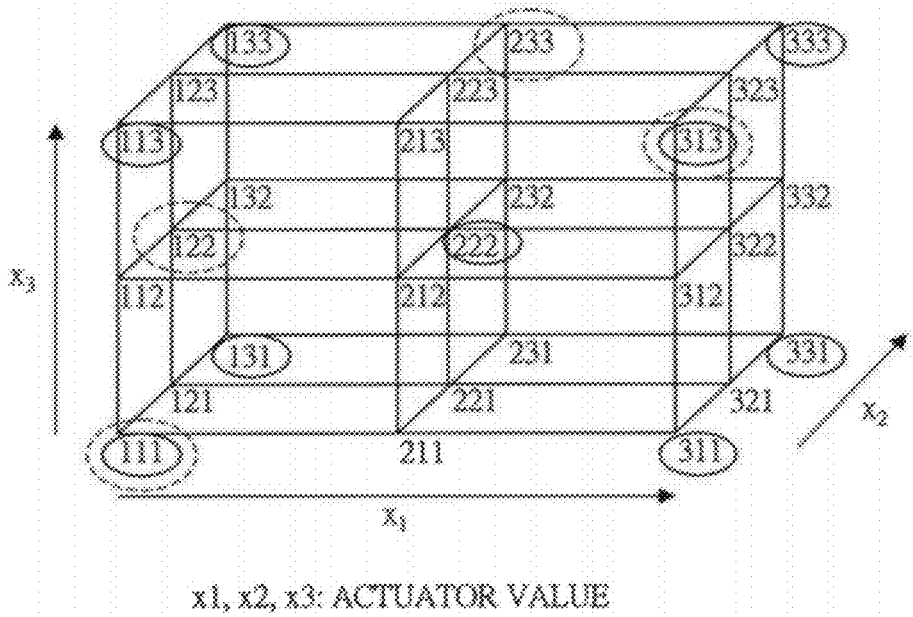
Figure 19A:
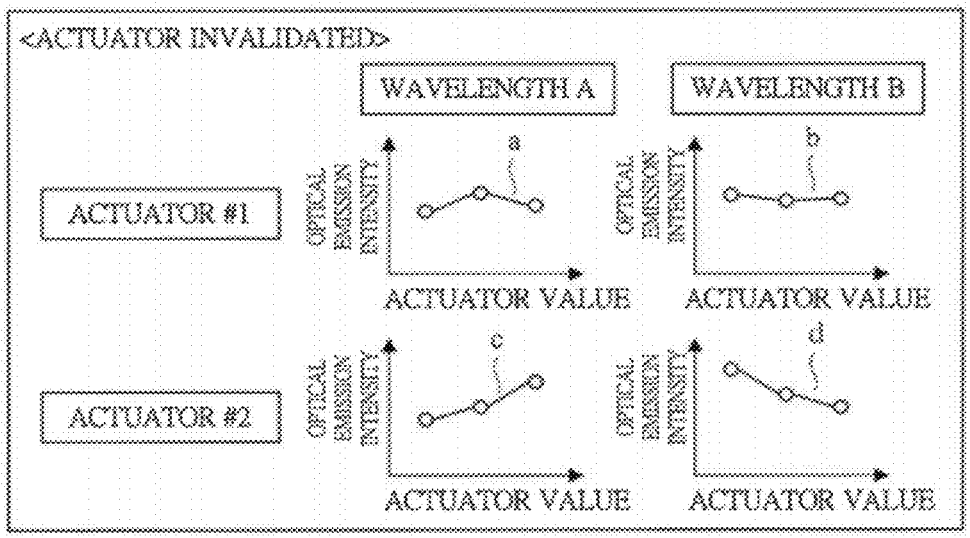
Figure 19B:
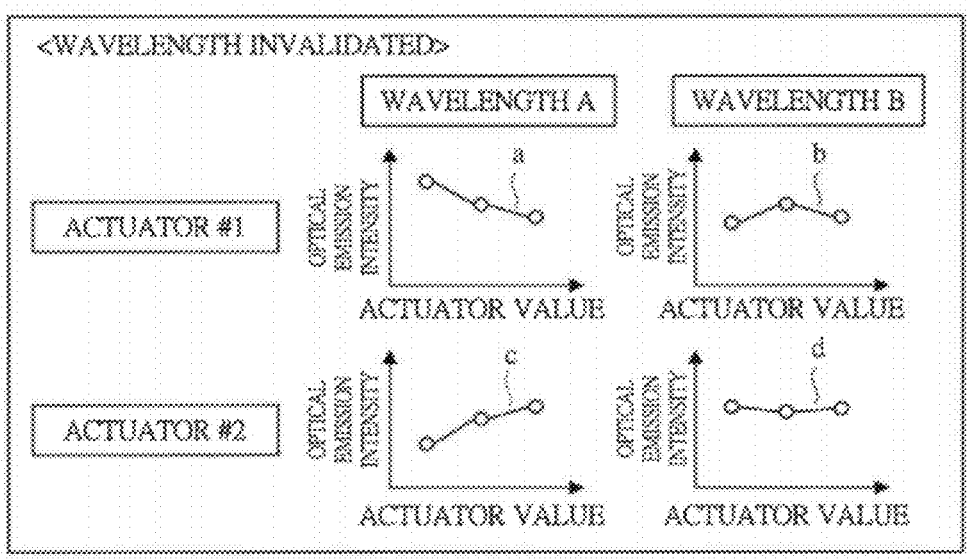
Figure 20A:
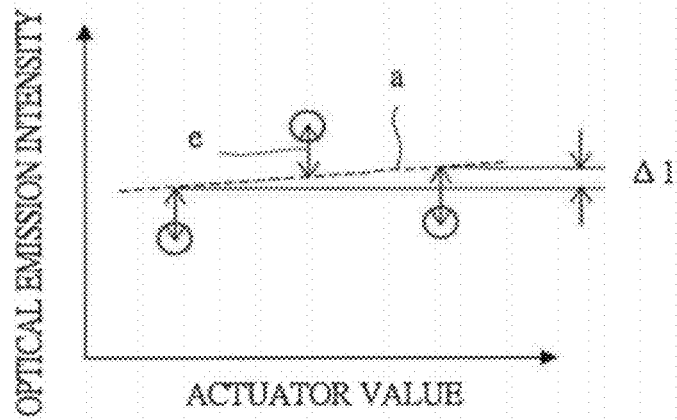
Figure 20B:
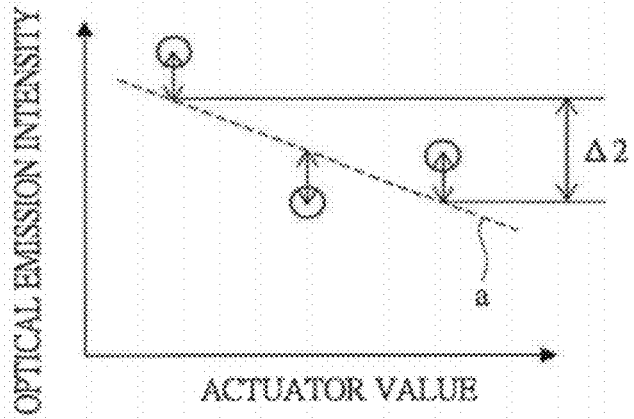
Figure 22:
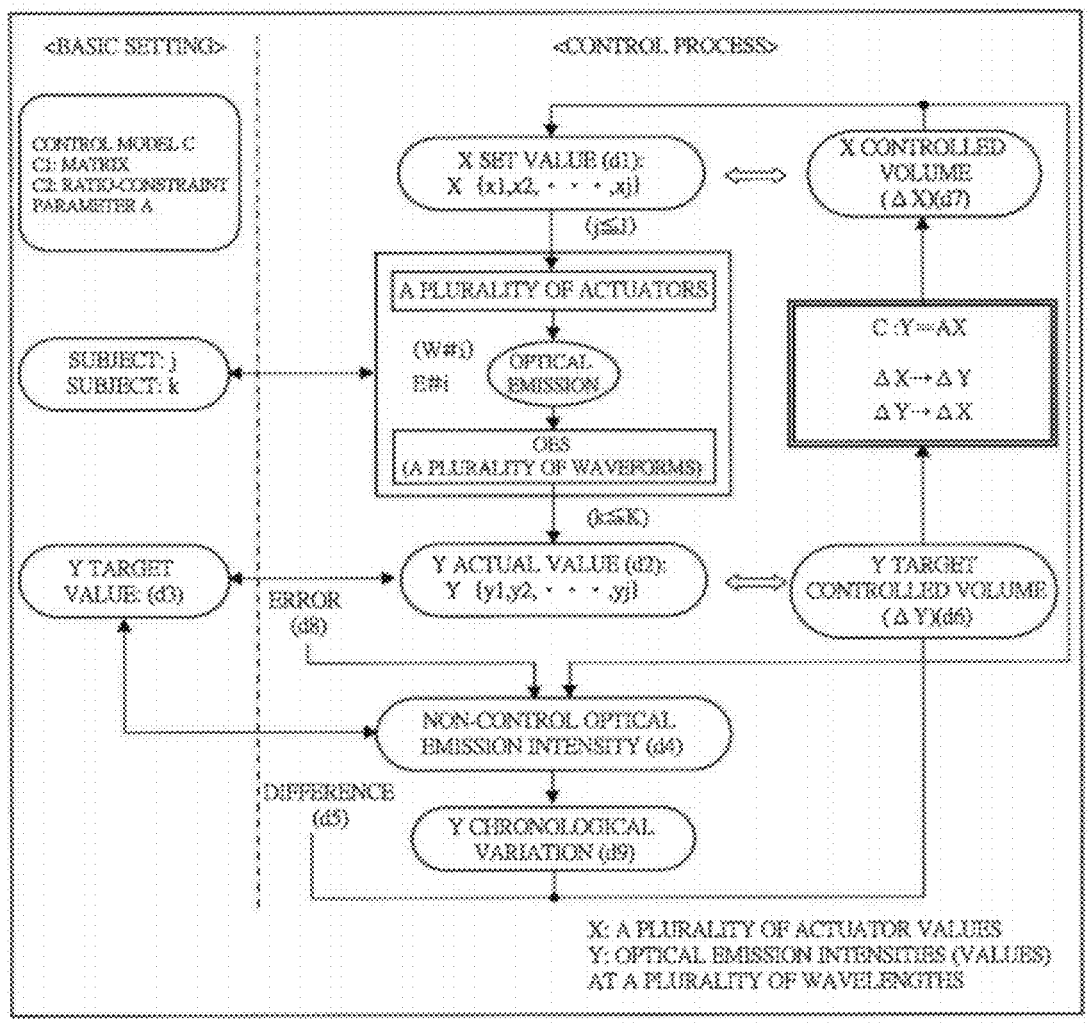

FIGS. 15A and 15B are explanatory diagrams showing an effect, etc., of integration of two control models (C1 and C2) (integrated model (C3)) according to the etching apparatus and the system of one embodiment of the present invention (second embodiment), FIG. 15A depicting the time-serves variation of an actuator value and FIG. 15B depicting the time-serves variation of an optical emission intensity;

FIG. 16 depicts a process flow of experimental work for determining parameters for control models according to the etching apparatus and the system of one embodiment of the present invention (third embodiment);

FIG. 17 is an explanatory diagram showing the necessity of an optical emission intensity (Y) time-serves variation model in experimental work;

FIG. 18 is an explanatory diagram of a level combination by orthogonal array related to design of experiments (DEO) in experimental work;

FIGS. 19A and 19B are graphs of cases where optical emission intensities do not change in experimental work, FIG. 19A depicting a case where optical emission intensities do not change depending on actuator values and FIG. 19B depicting a case where optical emission intensities do not change depending on wavelengths;

FIGS. 20A and 20B are explanatory diagrams showing a method of quantitatively judging the presence/absence of a change in an optical emission intensity to an actuator value in experimental work, FIG. 20A depicting a case of the absence of the change and FIG. 20B depicting a case of the presence of the change;

FIG. 21 depicts a process flow of the Run-to-Run control carried out by the etching apparatus, system, etc., of one embodiment of the present invention (fourth embodiment); and FIG. 22 is an explanatory diagram showing an outline of control according to one embodiment of the present invention.

BEST MODE FOR CARRYING OUT THE INVENTION

Hereinafter, embodiments of the present invention will be described in detail with reference to the accompanying drawings. Note that components having the same function are denoted by the same reference symbols in principle throughout the drawings for describing the embodiment, and the repetitive description thereof will be omitted.

<SUMMARY>

A summary of the embodiments will be described below. (For reference numerals, etc., see FIGS. 7, 22, etc.). The conventional technique described above poses the following problems. According to a method of calculating a plurality of actuator values, each actuator value is calculated separately based on a post-etching wafer quality. When adjustment of a plurality of actuator values affects any given wafer quality, that is, a plurality of sensor data (optical emission intensities at a plurality of wavelengths) related to the wafer quality, an actuator manipulated volume must be determined in consideration of influence on sensor data (optical emission intensities) between actuator values. In a case of optical emission intensities at a multiple wavelengths, which are sensor data monitored by an OES during an etching process, adjusting one actuator value leads to a change in optical emission intensities at a plurality of wavelengths.

In such a case, calculating an actuator value (manipulated volume) so as to match an optical emission intensity to a target value gives a calculated actuator value that cannot be set (out of a set allowable range) in an actual situation. When the relation (MIMO relation) between a plurality of actuator values and optical emission intensities at a plurality of wavelengths is modeled into a control model and parameters of the model are determined through an experiment, the number of wafers and man-hour in the experiment needed for determining the parameters increase. Run-to-Run control using the above-described MIMO relation control model and parameters thereof requires a number of setting items and variations thereof. As a result, when control evaluation is made in an actual etching process, the evaluation requires a long period or actually becomes impossible.

[System] Solutions (embodiments) of the present invention to the above-mentioned problems are as follows. An etching apparatus (system therefor) of the present invention includes a plurality of actuators and an OES, and has a function of Run-to-Run control for an etching process. According to this control, a plurality of actuator values (i.e., etching process conditions) are adjusted for each wafer processing (wafer etching process) to control optical emission intensity values Y at a plurality (multiplicity) of wavelengths. A method for the control is provided, according to which the relation between an adjustment of a value X and a change in the value Y is defined by at least two types of control models (C) and an actuator value X (manipulated volume) is so calculated that an optical emission intensity value Y matches an optical emission intensity target value or becomes close thereto. An experimental work method is also provided for determining a parameter (A) of the control model (C). A control simulation method is also provided for evaluating the performance of the Run-to-Run control without carrying out an actual etching process.

[Control model] The relation between the changes in the values (X, Y) (relation model) is defined by two types of control models. One is a control model in the form of a matrix expression (matrix model C1) (Matrix Control Model) defining so that the value X is calculated to match the value Y to a target value therefor. The other is a control model in the form of a ratio-constraint expression (ratio-constraint model: C2) (Ratio-Constraint Control Model) that constrains the relation between values Y for a plurality of wavelengths and the relation between values X for a plurality of actuators with respective ratios to define the proportional relation between the value X and value Y. Hence the relation between the values (X, Y) can be set by these models.

A model applicable to actual control is selected from a plurality of control models (C) depending on conditions, such as a range (allowable range) in which a command (setting) to an actuator (X) is actually possible and the required precision of an optical emission intensity Y (irregularity of optical emission intensities Y, etc.). In this manner, a fine control result is obtained.

A model (integrated model C3) created by integrating the above two models (C1, C2) allows calculation of an optimal actuator value X in consideration of the irregularity of optical emission intensities Y (second embodiment).

Control using a time-serves variation model (Ct) is devised for compensating (e.g., limiting) a time-serves variation of the value Y between lots (a plurality of lots) and wafers (a plurality of wafers) (respective embodiments).

[Basic setting] A plurality (j) of actuators ($1 \leq j \leq J$) as control subjects, a plurality (k) of wavelengths ($1 \leq k \leq K$), and a target value (or control value) for the optical emission intensity Y are set before execution of the above-described control (Run-to-Run control). J represents the (maximum) number of actuators incorporated in the etching apparatus, and K represents the (maximum) number of wavelengths that can be observed by the OES. The control is possible even in a case of j=1 or k=1. The control model (C) and a parameter (A) thereof are set (selected). For example, to match the optical emission intensity Y (actual value Y) as a control result to the target value, the matrix model (C1) is set. To limit a range of calculation of the actuator value X to be set, the ratio-constraint model (C2) is set. To bring the value Y closer to the target value as much as possible while limiting the range of the value X, the integrated model (C3) created by integrating the above two models (C1, C2) is set. A user is allowed to make these various basic settings.

[Control] In one etching process (for each wafer) under the above Run-to-Run control, the following control process is carried out (FIG. 22). At a first process step (S1), before the start of the etching process, a controlled volume (d7) for the actuator value X is calculated (for the current round of etching process), based on a "non-control optical emission intensity" (d4) and a Y time-serves variation (d9), and is set to an actuator (X set value (d1)). At a second process step (S2), the optical emission intensity Y (d2) is monitored by the OES during the etching process carried out by plasma optical emission based on the actuator set value (d1), and monitored data is stored. At a third process step (S3), following the etching process, the "non-control optical emission intensity" (d4) is calculated from the Y actual value (d2) based on the OES data (monitor value/obtained value). These steps (S1 to S3) are repeated at each etching process under the Run-to-Run control. S1 to S3 represent steps classified for convenience in the description.

The above-described configuration prevents the deterioration of etching process performance, etc., due to the abnormality of the calculation of actuator value X or insufficient adjustment of the actuator value X. The configuration also allows control over the optical emission intensity Y through monitoring of the material composition of plasma in the chamber of the etching apparatus, thus enabling control of an etching volume for etching a pattern formed depending on a plurality of substances and a film made of multiple compositions. Hence high-precision processing is achieved to meet a demand for micro-LSI fabrication, and the deterioration of the chamber due to foreign matter sticking thereto is suppressed.

[Experimental work] Experimental work is carried out as another function (third embodiment) for evaluating and determining the control model (C) and the parameter (A) thereof. According to the experimental work, a plurality of control models are compared and evaluated using the PLS regression analysis, etc., to determine (select) a model superior in precision. This model is determined using wafers fewer than wafers used in conventional model setting, so that experimental man-hour can be reduced. In the experimental work, a combination of levels necessary for calculation of the parameter (A) is selected utilizing a level combination based on a design of experiment, and parameters (A) for a plurality of models (C) are calculated through the PLS regression analysis, etc., (e.g., for the case of the ratio-constraint model C2), using actuator values X and Y actual values. Errors between the Y actual values and estimated values or predicted values are then compared and evaluated to determine a preferable control model (C) and parameter (A) out of the plurality of control models (C) and parameters (A). The determined control model (C) and parameter (A) are applied to actual control.

[Control simulation] As another function (fourth embodiment) in a control simulation processing of the Run-to-Run control, a "true control model" (referred to as second control model Cb for distinction) is defined as a control model different from the above-described control model (C) for control (referred to as first control model Ca for distinction) so as to obtain optical emission intensities Y at multiple wavelengths actually generated as a result of adjustment of the actuator value X. When optical emission intensities Y at multiple wavelengths are put under the Run-to-Run control by a plurality of actuator values X, evaluating the applicability of the parameter (A) through an actual etching process is usually difficult due to many setting items. According to this function (fourth embodiment), during repetition of etching processes under the Run-to-Run control, actual optical emission intensities (Y actual values as simulation values) are calculated based on the "true control model" (Cb) and actuator values X are repeatedly calculated based on the control model (Ca) for control, by which the Run-to-Run simulation is achieved. In this manner, the control can be applied to the actual etching apparatus earlier.

<Supplemental>

FIG. 22 is a supplemental chart showing an outline (image) of the control (Run-to-Run control) according to the embodiments (especially the first embodiment). (d1) and the like are symbols denoting various types of data. E denotes the etching apparatus and an etching process by the etching apparatus. The etching process is carried out in lots and wafers (W). For example, an etching process on a wafer W#i is referred to as etching process E#i. The etching apparatus includes a plurality (J) of actuators and the OES as elements of premised technique. The plurality (J) of actuators and the values of the same are collectively denoted as X (and are each denoted as x), and optical emission intensities at a plurality (K) of wavelengths that can be observed by the OES are collectively denoted as Y (and are each denoted as y).

Out of the plurality (J) of actuators, a plurality (j) of actuators are selected as subject actuators. X set values $\{x1, x2, \ldots, xj\}$ (d1) for the (j) actuators are set before the start of the etching process E#i (S1). Through this numerical value setting for the plurality of actuators, plasma optical emission during the etching process E#i is adjusted. During the etching process (S2), the optical emission intensity values Y at the plurality (K) of waveforms are monitored by the OES for the plasma optical emission, and are stored as OES data. Based on this OES data, Y values are obtained under given time-setting, as Y actual values (d2), at which a plurality (k) of waveforms are selected out of the plurality (K) of waveforms, as subject waveforms. These Y actual values $\{y1, y2, \ldots, yk\}$ (d2) are used for calculation.

In this control as a whole, the control model C and the parameter (factor) (A) thereof, the subject (for control) actuators and waveforms (j, k) related to values X and Y, a Y target value (d3), and other variables can be set as basic set values. This "setting" means user setting, etc., that can be made in advance, and does not mean "setting" during actual control and actual etching process (S1 to S3) (e.g., setting of the X set value (d1), etc.).

The control model C can be selected from the matrix model C1, ratio-constraint model C2, integrated model C3, etc., in accordance with each embodiment (or user setting, function, etc.). The parameter (A), etc., for the control model C can also be set in advance. Based on the above-described basic setting, the control model C has first to third process steps (S1 to S3) constituting the Run-to-Run control repeated as actual control (actual etching process, i.e., etching process E for each wafer).

The first process step S1 represents a process carried out before the current (#i) etching process E#i, and includes calculation of a Y target controlled volume (ΔY) (d6) from the "non-control optical emission intensity" (d4), calculation of an X controlled volume (ΔX) (d7) from the target controlled volume (ΔY) (d6), and setting of the X controlled volume (ΔX) (d7).

The second process step S2 represents execution of the current (#i) etching process E#i, in which the Y actual value (d2) is obtained from optical emission based on the X set value (d1) through monitoring by the OES.

Next, the third process step S3 represents a process carried out after the current (#i) etching process E#i, and includes calculation of the "non-control optical emission intensity" (d4) from the Y actual value (d2). Form the actual value (d2), the "non-control optical emission intensity" (d4), which is the "optical emission intensity under no control", is obtained through a calculation (using d3, d7, etc.). (The value (d4) calculated at S3 can be used at S1.)

Specifically, at the above-described step S1, a difference value (d5) between the "non-control optical emission intensity" (d4) and the Y target value (d3) is obtained and is determined to be the target controlled volume (ΔY) (d6). The X controlled volume (manipulated volume) (ΔX) (d7) is then determined from the Y target controlled volume (ΔY) (d6) (ΔY→ΔX), using the control model C (Y=AX). At the step S3, the "non-control optical emission intensity" (d4) is calculated, using an error (d8) between the Y actual value (d2) and the Y target value (d3) and the X controlled volume (manipulated volume) (ΔX) (d7) determined at the step S1.

At steps S2 or S3, the value Y (d2) (monitor value/obtained value) used for the calculation is obtained under given time-setting. In the present embodiment, a value at a given time point or a total value within a given process time range is obtained from a monitor value (Y) given by the OES at the step S2 and is determined to be the value (d2).

When the X controlled volume (ΔX) (d7) is calculated at the step S1, an allowable range, etc., for the X set value (d1) is applied as a condition to the calculation to prevent abnormal setting.

When the time-serves variation (see, e.g., FIG. 3) of the value Y among lots and wafers is controlled (compensated), the variation is controlled using a time-serves variation model (Ct) for the value Y. In this case, at the calculation of the "non-control optical emission intensity" (d4) at the step S3, the time-serves variation (d9) is calculated, base on which the Y target controlled volume (d6) is calculated.

<Etching Device and System>

Figure 4:
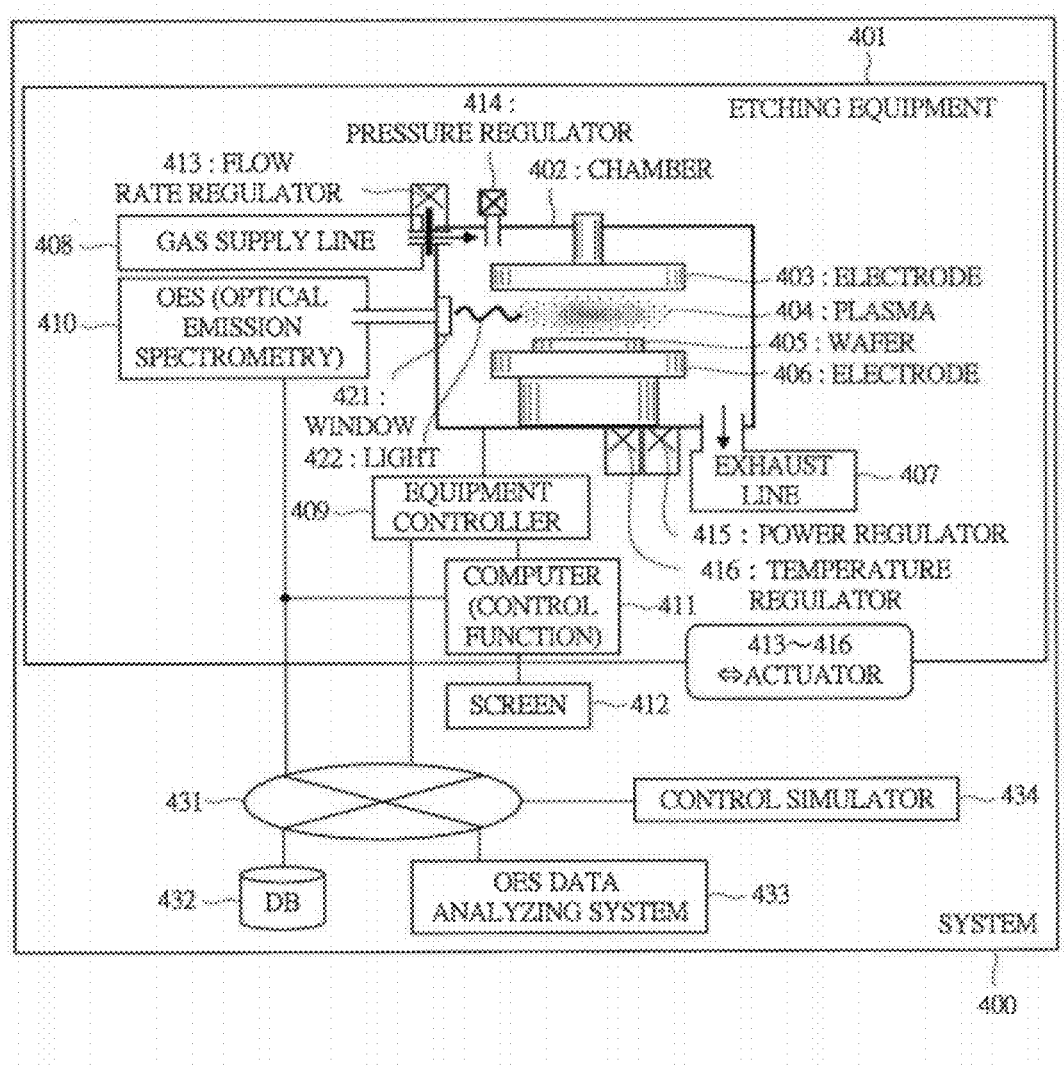
FIG. 4 depicts a configuration example of an etching apparatus and a system including the same according to one embodiment of the present invention.
Figure 5:
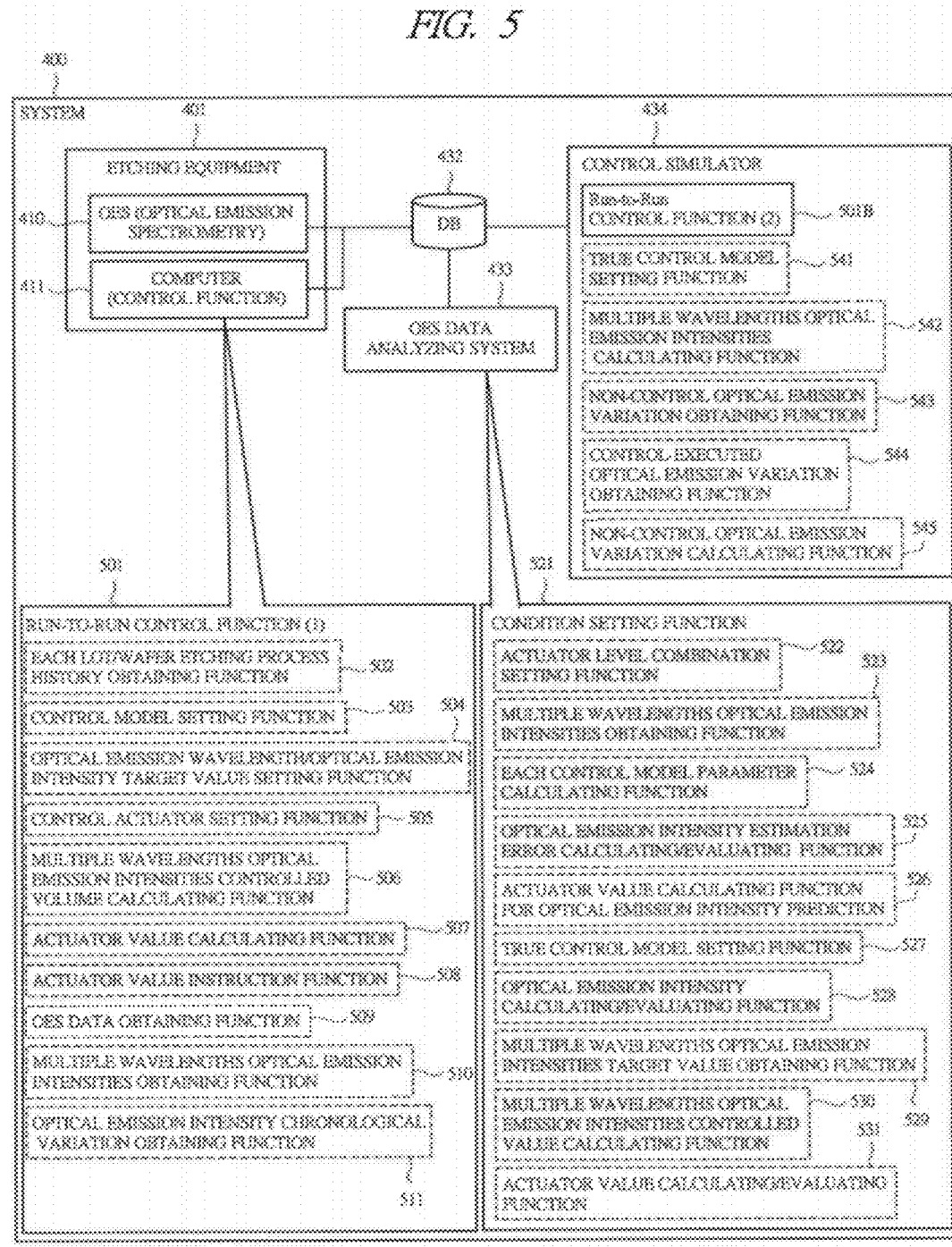
FIG. 5 depicts a configuration example of individual functions of the system of FIG. 4.

Configurations and operations of an etching apparatus 401 and a system 400 including the same according to one embodiment of the present invention will be described with reference to FIGS. 4 and 5. Configurations shown in FIGS. 4 and 5 include components of other embodiments, which will be described later. FIG. 4 mainly depicts a configuration of the etching apparatus 401, and FIG. 5 depicts configurations of individual functions. The whole system including the etching apparatus 401 and other constituent elements (432, 433, 434, etc.) is referred to as system 400 (etching control system).

In FIG. 4, the etching apparatus 401 includes a chamber 402, an electrode 403, a wafer 405, an electrode 406, an exhaust line 407, a gas supply line 408, an apparatus controller 409, an OES (Optical Emission Spectroscopy) 410, a computer 411, a screen 412, a flow regulator 413, a pressure regulator 414, a power regulator 415, and a temperature regulator 416. The apparatus controller 409 includes an external communication device. The computer 411 is a computing system including a memory device, and provides a control function (including a setting function and a Run-to-Run control function) characteristic of the etching apparatus 401. The screen 412 is provided as a terminal, display, etc., a user interface (e.g., GUI) that facilitates user input/output operations. The chamber 402 has a window 421, through which light 422 emitted from plasma (plasma optical emission) is observed by the OES 410. The OES 410 can be regarded as a kind of a sensor.

The etching apparatus 401 is connected to a database (DB) 432 via a network 431. For data sharing, the network 431 and the database (DB) 432 are connected to an OES data analyzing system 433 functioning as a computer system and a control simulator 434.

The wafer 405 is etched in the chamber 402. The wafer 405 is set between the electrode 403 and the electrode 406, where the plasma 404 is generated to etch the surface of the wafer 405. The plasma 404 may be generated by other means than the electrodes. A gas material necessary for etching is supplied through the gas supply line 408, and is discharged through the exhaust line 407 when the etching is over.

The etching apparatus 401 includes the flow regulator 413, pressure regulator 414, the power regulator 415, and the temperature regulator 416, etc., that serve as a plurality of actuators. These regulators adjust the flow rates of various gas materials, the internal pressure of the chamber 402, current and voltage applied to the electrodes 403 and 406, and further, temperature, respectively. This adjustment (that is, setting of actuator values X) is executed by following an instruction from the apparatus controller 409.

The plasma 404 emits the light 422, which is observed by the OES 410 to monitor optical emission intensities for individual wavelength. The OES 410 and the apparatus controller 409 are connected to the computer 411 installed in the etching apparatus 401. The apparatus controller 409 has a basic control function for the etching process by the etching apparatus 401.

The computer 411 (control function) calculates the manipulated volume (controlled volume) (d7) for each actuator value X, based on the optical emission intensity value Y at each wavelength monitored by the OES 410, and exchanges data with the apparatus controller 409. The computer 411 stores data of lot-by-lot processing, the frequency and order of etching process of each of wafers in each lot, etc., (processing/etching process information), determines the manipulated volume for the actuator value X according to the data, and gives an instruction to the apparatus controller 409.

The computer 411 is connected to the screen 412, which displays various information items (based on data stored in the computer 411 and the DB 432), such as the actuator value X, the optical emission intensity value Y, various set values, and process/etching process information, to the user (operator, engineer, administrator, control designer, etc.). Information that can be set by the user, such as the type (form) of the control model C and the parameter (A) necessary for control and each subject wavelength and the Y target value (d3) for the wavelength, can be set on the screen 421 by the user. Set information is stored in the computer 411, the DB 432, etc., and is used for the control.

The OES 410, the apparatus controller 409, and the computer 411 in the etching apparatus 401 are connected to the DB 432 via the network 431, information data is stored in the DB 432, and is referred when necessary.

On the screen 412, the user is able to set information on the etching process, such as the actuator value X and a wafer processing sequence, through operations on the screen and to enter an arbitrary instruction to carry out the etching process. To carry out experimental work for determining the control model C and the parameter (A), the X set value for each actuator used for control is set variously to carry out the etching process (experimental). The OES data and the X set value in the etching process are stored in the DB 432. Referring to the stored data, the user determines the control model C and the parameter (A) thereof, using the OES data analyzing system 433 (experimental work function 521). The OES data analyzing system 433 may be provided in the form of software that is executed by the computer 411, etc., in the etching apparatus 401.

The data stored in the DB 432 includes device log data, such as operation data of each actuator in the etching apparatus 401, X set values (d1) for a plurality of actuators, OES data (monitor data) on optical emission intensities Y at a plurality of wavelengths, Y actual values (d2) based on the OES data, and time-serves variation data of the optical emission intensity Y for a plurality of lots and wafers. The data also includes setting information, such as a plurality (k) of wavelengths as a control subject and the Y target value for the wavelengths, and a plurality (j) of actuators. The data also includes the types (forms) of a plurality of control models C and parameters (A) of the control models C. The data further includes information for controlling the steps, order, etc., of the etching process on lots and wafers and data on a processing history (data obtained from an existing manufacturing control system, etc.)

The control simulator 434 (a Run-to-Run control function 501B) takes in data from the DB 432, etc., and executes a Run-to-Run control simulation, thereby evaluating the result of control over the optical emission intensity Y. Even if the control simulator 434 is not connected to the network 431, the simulation can be executed by setting necessary data on a PC terminal in which the control simulator 434 is installed. The control simulator 434 may be provided in the form of software that is executed by the computer 411, etc., in the etching apparatus 401.

The computer 411 (control function) is incorporated in the etching apparatus 401 according to the present embodiment. The computer 411, however, may be incorporated together with the OES data analyzing system 433 and the control simulator 434, etc., in an external system connected to the etching apparatus 401.

<Function>

The system 400 of FIG. 5 includes various functions. In the system 400, the computer 411 (control function) of the etching apparatus 401 has a Run-to-Run control function 501 (components: 502 to 511 etc.), the OES data analyzing system 433 has the experimental work function 521 (constituent elements: 522 to 531), and the control simulator 434 has the Run-to-Run control function 501B (components: 541 to 545). In this configuration including these various functions, optical emission intensities Y at a plurality of wavelengths are controlled through a plurality of actuator values X for each lot and wafer (first and second embodiments), and experimental work (third embodiment) and a control simulation (fourth embodiment) can be carried out.

[Run-to-Run control function] First, the Run-to-Run control function 501 achieved by computing by the computer 411 will be described. The control simulator 434 has the similar Run-to-Run control function 501B. The Run-to-Run control function 501B is, however, a control simulation function corresponding to the Run-to-Run control function 501 (for actual control).

An example of a control target is to compensate the time-serves variation of the optical emission intensity Y for each etching of wafers in a lot (e.g., to match the value Y to the target value). To that end, the each lot/wafer etching process history obtaining function 502 obtains history information indicating the number of wafers processed after maintenance of equipment, etc., from the DB 432. According to the Run-to-Run control, the actuator value X is calculated based on the control model C to compensate a variation of the optical emission intensity Y. For this process, the control model setting function 503 sets the control model C and the parameter (A) thereof before the control is carried out. In addition, the optical emission wavelength/optical emission intensity target setting function 504 allows the user, etc., to set subject optical emission wavelengths (number in k) necessary for the calculation and the target value (d3) for optical emission intensities Y at the subject optical emission wavelengths, and the control actuator setting function 505 allows the user, etc., to set subject actuators (number in j) used for the control.

In the actual control steps (S1 to S3) based on the basic setting, to start the current (#i) wafer (W#i) etching process (E#i), the multiple wavelengths optical emission intensities controlled volume calculating function 506 first calculates (S1) a variation $\Delta Y$ (Y target controlled volume (d6)) of the optical emission intensity Y to be controlled, from the time-serves variation (d9) of the optical emission intensity Y resulting in the previous (#i−1) and past wafer etching processes and the Y target value (d3). Based on the calculated Y target controlled volume (d6), the actuator value calculating function 507 calculates variations $\Delta X$ (X controlled volume) (d7) of a plurality of actuator values X for control, using the control model C. An actuator value instruction function 508 then executes to transmit each actuator value X (X set value (d1)) based on the above calculated value (d7) or send an instruction on each actuator value X, to the apparatus controller 409, then the apparatus controller 409 sets (applies) the X set value (d1) on the corresponding actuator. Hence the current etching process (E#i) (S2) is ready to start.

During the etching process by the etching apparatus 401 (S2), plasma optical emission is monitored by the OES 410, and the OES data obtaining function 509 obtains a monitored value (OES data) from the OES 410 and stores the OES data in the computer 411. The multiple wavelengths optical emission intensities obtaining function 510 then obtains actual values (d2) for a plurality (k) of subject wavelengths specified by the user setting, from the OES data. The OES data is waveform data collected by sampling at given short time-intervals during the etching process. The actual values (d2) are, therefore, obtained by extracting values under given time-setting, i.e., at specific time points (intervals) or a total of averages, maximums, minimums, etc., in a given process time range, out of the OES data.

The optical emission intensity time-serves variation obtaining function 511 calculates the "non-control optical emission intensity" (d4), which is the "optical emission intensity under no control", from the above Y actual value (d2) (an error (d8) between the Y actual value (d2) and the Y target value (d3)) and the X manipulated/adjusted volume (d7). This "non-control optical emission intensity" (d4) is added to the time-serves variation (d9) of the optical emission intensity Y resulting in the previous and past wafer etching processes to determine the time-serving variation (d9) of the optical emission intensity Y resulting in the current and past etching processes. Based on the determined value (d9) (and an error (d5) between (d3) and (d4)), the Y target controlled volume (d6) for compensating a time-serves variation of the optical emission intensity Y in the next (#i+1) wafer etching process (E#i+1) can be determined.

[Experimental work function] Next, the experimental work function 521 achieved through the process by the OES data analyzing system 433 will be described. The experimental work function 521 may be a function achieved by a component other than the OES data analyzing system 433, such as the computer 411 in the etching apparatus 401.

Experimental work based on a design of experiment is carried out to create a model of the relation between a variation of a plurality of actuator values X and a variation of optical emission intensities Y at a plurality of wavelengths, in the form of an equation. To that end, the actuator level combination setting function 522 sets several levels of values (X) to individual actuators and determines a combination of levels set to actuators. Wafers of which the number is equivalent to the number of combination of levels and several wafers are prepared, the several wafers being used for acquiring a reference for a time-serves variation of the optical emission intensity Y during consecutive etching of a plurality of wafers, and the prepared wafers are actually subjected to the etching process by the etching apparatus 401. Plasma optical emission during the etching process is monitored by the OES 410, and collected OES data is stored in the DB 432.

The multiple wavelengths optical emission intensities obtaining function 523 obtains the optical emission intensities Y (Y actual values (d2)) at a plurality of wavelengths, from the OES data. These subject wavelengths and time points of data acquisition during the etching process are specified by, for example, user setting. When a time-serves variation of the optical emission intensity Y results due to repeated wafer etching processes, the optical emission intensity Y of wafer etching process for acquiring a reference for the time-serves variation is interpolated in the order of the etching processes, and the interpolated optical emission intensity Y is subtracted from the Y actual value (d2) actually monitored after interpolating and extrapolating the optical emission intensity Y at the processing of the level combination wafers. In this manner, a variation (ΔY) of the optical emission intensity Y corresponding to an actuator manipulated volume (ΔX) can be obtained.

The each-control-model model parameter calculating function 524 estimates the parameter (A) of the control model C with the optical emission intensity Y as output and the actuator value X set to the actuator as input. This control model C includes the matrix model C1 and the ratio-constraint model C2. The ratio-constraint model C2 defined by the equations (5) and (6) allows variable setting of the number column for parameters P and Q, which creates a plurality of ratio-constraint models C2 in correspondence with the variable setting. The parameter (A) is thus estimated for each of such a plurality of control models C.

The optical emission estimation error calculating/evaluating function 525 substitutes the above-described set actuator value X in each control model C to estimate the optical emission intensity Y, and totals errors between actual values and estimated values to compare and evaluate the precisions of each control model C.

Predicting the optical emission intensity Y enables evaluation of the precision of experimental work. To evaluate the precision of experimental work, the optical emission predicting actuator value calculating function 526 calculates the actuator value X (for predicting the optical emission intensity) and sets the actuator value X.

The "true control model" setting function 527 assumes (estimation, setting, etc.) the "true control model" (Cb) and the parameter (A) thereof, which is equivalent to obtaining the optical emission intensity Y (Y actual value) resulting in an actual etching process.

Based on each control model C estimated as the "true control model" (Cb) and the parameter (A) thereof, the optical emission intensity calculating/evaluating function 528 calculates the optical emission intensity Y using the actuator value X, to compare and evaluate calculated optical emission intensities Y.

The multiple wavelengths optical emission intensities target value obtaining function 529 obtains information of the Y target value (d3), etc., from the DB 432.

The multiple wavelengths optical emission intensities controlled volume calculating function 530 calculates a difference between the optical emission intensity Y calculated from the actuator value X based on the "true control model" (Cb) and the Y target value, as Y controlled volume (d6).

Based on each control model C for which the parameter (A) is estimated, as described above, the actuator value calculating/evaluating function 531 calculates the actuator value X (manipulated volume (d7)) using the Y manipulated volume (d6). In this manner, actuator variations can be compared and evaluated based on each control model C.

[Control simulator] Next, the function of the control simulator 434 will then be described. The control simulation can be achieved by mainly using the Run-to-Run control function 501B. Setting the control model C, subject wavelengths, Y target value (d3), control actuators, etc., before execution of the Run-to-Run control is in the same manner as the above-described Run-to-Run control function 501. To calculate the optical emission intensity value Y without carrying out an actual etching process, the "true control model" (Cb) is preset (as the model different from the control model (Ca) for control) by the "true control model" setting function 541. To carry out a control simulation of an etching process for each lot and each wafer in the lot, data of a time-serves variation of "proper optical emission intensity" caused by repeated etching processes is required. The non-control optical emission intensity variation obtaining function 543 thus obtains this data (non-control optical emission intensity variation data) from the DB 432. When data of the optical emission intensity Y (Y actual value) during the actual etching process is data from the Run-to-Run control actually executed, the control-executed optical emission variation obtaining function 544 obtains the data and data of setting and log of the control model C, parameter (A), actuator value (X), etc., from the DB 432. The non-control optical emission variation calculating function 545 then calculates the Y controlled volume (d6) from the control model C, parameter (A), actuator value (X), etc., and subtracts the calculated Y controlled volume (d6) from the optical emission intensity Y to determine the above-described non-control optical emission intensity variation data.

Before the wafer etching process (S2), the actuator value calculating function 507 calculates the actuator value X (controlled volume), referring to the Y time-serves variation in the previous and past wafer etching process. A calculation process (simulation) equivalent to execution of the actual etching process (S2) is then carried out. Based on the "true control model" (Cb), the multiple wavelengths optical emission intensities calculating function 542 calculates the Y controlled value, using the actuator value X, and adds the "true non-control optical emission intensity" to the Y controlled value to obtain a control result of the optical emission intensity Y (simulation result). This optical emission intensity Y is taken to be the optical emission intensity (Y actual value) monitored by the OES 410, from which the Y time-serves variation is determined by the optical emission intensity time-serves variation obtaining function 511 in the same manner as in the case of the Run-to-Run control function 501. It should be noted that the Y controlled volume subtracted from the optical emission intensity Y at this time is calculated at the calculation of the actuator value X and is not the Y controlled value based on the "true control model" (Cb).

First Embodiment

Based on the configurations described above, a control process of the etching apparatus and the system according to a first embodiment will be described with reference to FIGS. 6 to 14.

<Run-to-Run Control>

Figure 6A:
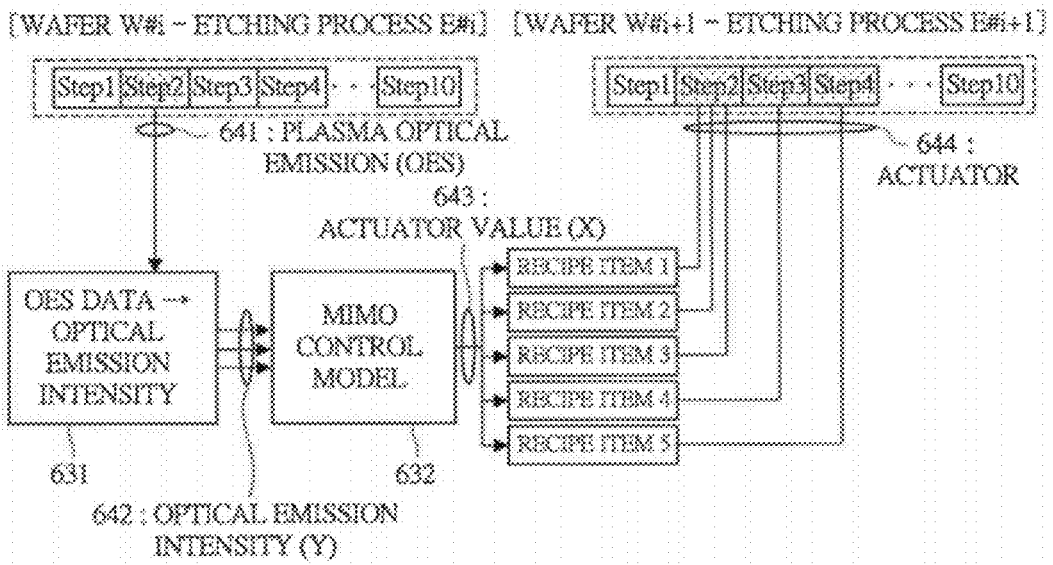
FIGS. 6A and 6B are explanatory diagrams showing a basic of Run-to-Run control according to the premised technique and one embodiment of the present invention.

The basic of APC Run-to-Run control using the etching apparatus 401 will be described with reference to FIG. 6. As shown on the left side in FIG. 6A, the i-th wafer W#i is subjected to the current (#i) etching process E#i. This etching process E#i consists of, for example, 10 steps (etching steps) of step 1, step 2, . . . , Step 10. Each step has its specific processing details, such as etching process start, main etching, under layer etching, residue elimination, and etching end. The makeup of these steps, therefore, changes depending on a desired etching process. At each step, the OES 410 monitors plasma optical emission.

For example, optical emission intensities (Y) 642 at a plurality (K) of wavelengths are obtained from OES data of plasma optical emission 641 monitored at step 2 (process 631). Before the start of an etching process E# (i+1) on the next (i+1)-th wafer W# (i+1) shown on the right side in FIG. 6A, based on a control model (MIMO control model) 632, a plurality of actuator values (X) 643 are so calculated that the optical emission intensity value Y matches the target value (d3), referring to the optical emission intensities (Y) 642. The actuator values (X) 643 are set to, for example, recipes of "recipe item 1", "recipe item 2", . . . , "recipe item 5". These recipes represent etching process conditions made up of a plurality of items. The above elements of actuator values X, etching process conditions (recipes), etching steps, etc., (the number of each element is one or more) have a given mutual relation, so that a plurality of actuators (X) are the subject of direct control.

Based on the above setup, the etching process E# (i+1) on the wafer W# (i+1) is started. For example, at step 2, an actuator 644 (one or more of related elements) operates based on the values of the "recipe item 1", "recipe item 2", and "recipe item 3". Similarly, for example, the actuator 644 operates based on the value of the "recipe item 4" at step 3 and on the value of "recipe item 5" at step 4. Such a process is repeated at each wafer etching process (E#) to achieve the Run-to-Run control.

Figure 6B:
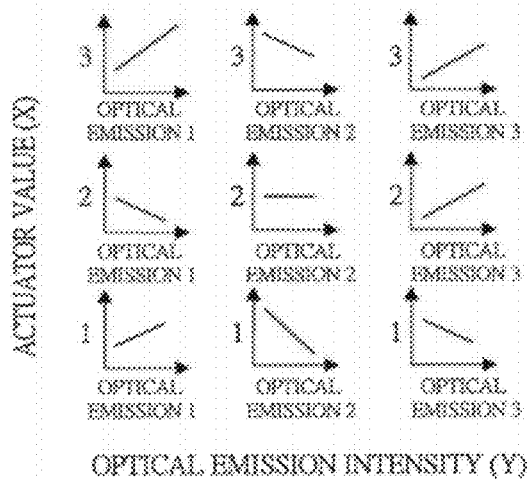

To determine the plurality of actuator values (X) 643 based on the control model (MIMO control model) 632, the MIMO numerical relation between the optical emission intensity Y plotted on the horizontal axis and the actuator value X plotted on the vertical axis must exist for the control model 632, as shown in FIG. 6B. Optical emission changes depending on the state of the plasma 404 in the chamber 402, and the state of the plasma 404 is adjusted by actuators (413 to 416), such as a gas flow rate, current, and voltage (FIG. 4). Hence the control model C is defined as the optical emission intensity Y correlated with the actuator value X (C: Y=AX, ΔX→ΔY).

In the plasma, one substance emits light of a plurality of wavelengths and chemical reactions occur as chain reactions. A change in a specific substance, therefore, affects the volume of other substances. However, variations of substances resulting from reactions in the chamber 402 are diverse. For example, argon, which is an inert gas, does not directly contribute to a chemical reaction. Among wavelengths that are the subject of control, wavelengths at which the optical emission intensity Y changes are limited depending on substances of which the volume changes in correspondence to a change in the actuator value X. In other words, it is assumed that at some wavelengths, the optical emission intensity Y changes independently while at other wavelengths, the optical emission intensity Y changes in connection with other optical emission intensity changes, in correspondence to a change in each actuator. For this reason, in the present embodiment, the control model C is defined as two types of control models, which are the matrix model C1 and the ratio-constraint model C2.

<Control Model>

Figure 7A:
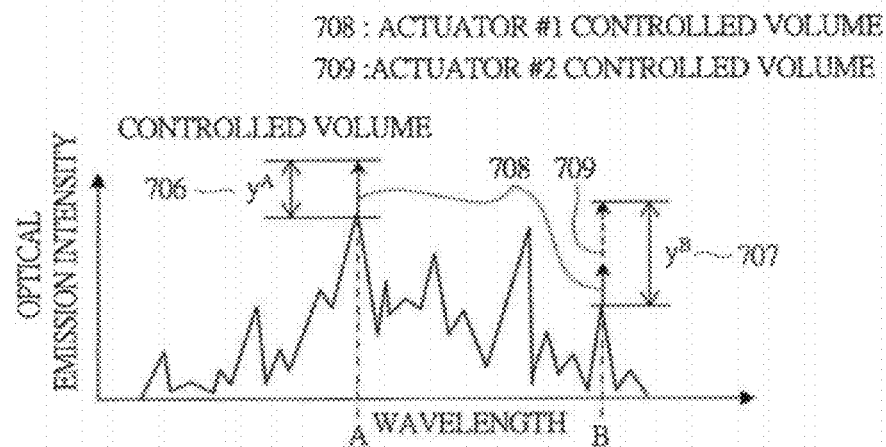
FIGS. 7A and 7B are explanatory diagrams showing details of two control models, FIG. 7A depicting a matrix control model (C1) and FIG. 7B depicting a ratio-constraint control model (C2), according to one embodiment of the present invention.
Figure 7B:
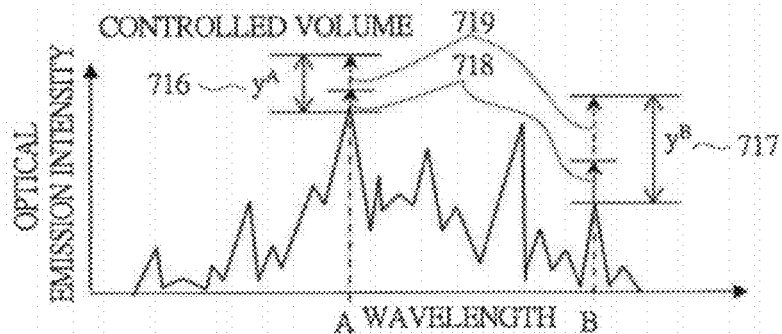

The control models (C1, C2) will be described with reference to FIG. 7. FIG. 7A is a graph of the matrix model C1, and FIG. 7B is a graph of the ratio-constraint model C2. Both of FIGS. 7A and 7B exhibit an optical emission spectrum plotted on the graph with the horizontal axis representing wavelength and the vertical axis representing optical emission intensity Y. Both models of FIGS. 7A and 7B indicate an example in which optical emission intensities Y at two wavelengths (A, B) are controlled by two actuators (#1, #2).

The matrix model C1 of FIG. 7A is defined based on that the optical emission intensity Y at each wavelength can be controlled to match a target value through each one of a plurality of actuator. Wavelengths as control subjects are the wavelengths A and B. The Y target controlled volume (d6), which is the difference or error (d5) between the Y target value (d3) and the "non-control optical emission intensity" (d4), is indicated as $y^A$ (706) at the wavelength A and as $y^B$ (707) at the wavelength B. Adjusting the actuator #1 (its controlled volume) (708) leads to a change in the optical emission intensity Y at both wavelengths A and B, but adjusting the actuator #2 (its controlled volume) (709) results in a change in the optical emission intensity Y only at the wavelength B. In such a case, the actuator #1 (708) is so adjusted that the controlled volume $y^A$ (706) is achieved, and a shortage to the controlled volume $y^B$ (707) resulting from the adjustment of the actuator #1 (708) is covered by adjustment of the actuator #2 (709). In other word, the actuator value X is determined so that the target controlled volume is obtained. The matrix model C1 is expressed as an equation (7), and an equation for calculating the actuator value X is given as an equation (8).

[Equation 7]

$$y^T = x^T A^T \tag{7}$$

[Equation 8]

$$x^T = y^T (A^T)^{-1} \tag{8}$$

where $y^T = [y^A \ y^B \ \ldots \ y^{Char(N)}]^T$, $x^T = [x_1 \ x_2 \ \ldots \ x_M]^T$ and N denotes the number of wavelengths (and the number of sensors) (corresponding to k, K described above), M denotes the number of actuators (corresponding to i, J described above), and N must be equal to M (N=M) (in the case of C1). Char (i)

represents an i-th alphabetical capital letter. The parameter A is given by the following equation (9).

[Equation 9]

$$A = \begin{bmatrix} a_1^A & a_1^B & \cdots & a_1^{Char(N)} \\ a_2^A & a_2^B & \cdots & a_2^{Char(N)} \\ \vdots & \vdots & \ddots & \vdots \\ a_M^A & a_M^B & \cdots & a_M^{Char(N)} \end{bmatrix} \quad (9)$$

This parameter A can be determined by a multiple regression analysis (in the case of C1).

The ratio-constraint model C2 of FIG. 7B is defined based on a fact that adjusting each actuator value X causes the optical emission intensity Y at each wavelength to change at a fixed ratio. Adjusting the actuator #1 (its controlled volume) (718) leads to a change in the optical emission intensity Y at both wavelengths A and B, and adjusting the actuator #2 (its controlled volume) (719) also leads to a change in the optical emission intensity Y at both wavelengths A and B. Variations ΔY of the value Y at respective wavelengths take a fixed ratio in correspondence to each adjusted actuator. Thus, an actuator manipulated volume (ΔX) is so determined that a Y controlled volume comes closer to two Y target controlled volumes as much as possible. The ratio-constraint model C2 is given by the following equations (10) and (11).

[Equation 10]

$$y^T = tBQ^T \quad (10)$$

[Equation 11]

$$x^T = tP^T \quad (11)$$

where the internal variables $t=[t_1, t_2, \ldots t_L]$, and L is referred to as the number of internal models. The parameter P is a matrix composed of M lines and L columns, and is defined as $P=[p_1, p_2, \ldots, p_L]$, $p_i^T=[p_{1i}, p_{2i}, \ldots, p_{Mi}]$. The parameter Q is a matrix composed of N lines and L columns, and is defined as $Q=[q_1, q_2, \ldots, q_L]$, $q_i^T=[q_{1i}, q_{2i}, \ldots q_{Ni}]$. The affix i represents an internal model number. The parameter B is defined as $B=\text{diag}\{b_1, b_2, \ldots, b_L\}$, which is a square matrix with diagonal elements of $b_1, b_2, \ldots b_L$ and other zero elements. The number of actuators M may be different from the number of wavelengths N (in the case of C2). L must be equal to or less than min{N, M}, where min{a, b} represents an arithmetic processing for choosing the smaller one of a and b. The parameters P, Q, B can be determined by the PLS regression analysis. x denotes input (corresponding to X) and y denotes output (corresponding to Y). The internal variable t is referred to as score, and the parameters P and Q are referred to as loading. The parameter B is a weight for integrating internal variables into the input side and output side ($y^T Q (Q^T Q)^{-1}=tB$, $x^T P (P^T P)^{-1}=t$), thus serving as an internal parameter. 0132 Eliminating the internal variables t from the equations (10) and (11) gives the following equations (12) and (13), which indicate that the internal variables t are not necessary for estimating the optical emission intensity Y or calculating the actuator value X.

[Equation 12]

$$y^T = x^T P(P^T P)^{-1} B Q^T \quad (12)$$

[Equation 13]

$$x^T = y^T Q(Q^T Q)^{-1} B^1 P^T \quad (13)$$

FIG. 14 depicts a comparison table of the above two control models C. The matrix model C1 is characterized by controlling optical emission separately by each actuator, allowing fine adjustment in control. Parameters of the model C1 are set by the multiple regression analysis. The ratio-constraint model C2 is characterized by distributing controlled volumes among actuators, thus aiming at chemical-reaction-oriented control. Parameters of the model C2 are set by the PLS regression analysis.

<Process Flow>

The contents of the Run-to-Run control of the first embodiment will be described referring to a process flow chart shown in FIG. 8 (where S801, etc., represent process steps). Before the start of the control, basic setting items necessary for the control are set at steps S801 to S803 (by the user, etc.). At step S801, optical emission intensity (Y) information is set. In other words, the information including a plurality (k) wavelengths subjected control, the Y target value (d3) for each wavelength, an etching step for obtaining the optical emission intensity Y from OES data, and a Y totaling method are set. The etching step is, for example, step 2, etc., of FIG. 6 described above, and the Y totaling method is the above method of determining the optical emission intensity value Y from values obtained under given time-setting based on OES data, such as an average in a time span of 20 seconds from the start of the etching process or between 30 seconds and 40 seconds from the start.

To set a subject wavelength, such a wavelength must be selected first. Since it is known that plasma emits light at a wavelength corresponding to a specific substance, a wavelength can be selected based on an assumed chemical reaction. A wavelength may be determined by another method, according to which a peak on an optical emission spectrum is automatically detected based on a threshold, spectrum irregularities, etc. Whether the optical emission intensity Y shows a time-serves variation is confirmed by observing OES data. If an observation of waveforms during the etching process (optical emission intensities in a process time) reveals that a waveform with a great change contributes greatly to a chemical reaction, the wavelength of such a waveform is selected. In addition, waveforms are sorted out by judging the similarity of waveforms of a plurality of wavelengths and concluding that waveforms much similar to each other represent optical emission caused by the same substance.

The Y target value (d3) can be determined by, for example, referring to the optical emission intensity value Y resulting in the etching process carried out under reference etching process conditions (recipes, etc.). If the result of inspection of a wafer subjected to the actual etching process, such as a CD (Critical Dimension) and aspect ratios of gates and wiring, is checked against OES data and a relation model of the relation between the inspection result and the optical emission intensity Y is created, the optical emission intensity Y that brings a desired inspection result can be determined. In high-volume manufacturing, in addition to the Y target value (d3), a control value for the optical emission intensity Y may also be set to control the precision of repeated etching.

At S802, a plurality (j) of actuators used for the control are specified. Since etching is a chemical reaction, the volume of substances in the chamber 402 is adjusted by introducing a specific gas into the chamber 402, and reaction speed is adjusted by pressure and temperature conditions. The ionized/dissociated state of the plasma 404 is determined by an electromagnetic condition in the chamber 402, and is, therefore, adjusted by relevant actuators, such as power.

Each actuator value (X) accompanies a substantial physical limitation (set allowable range) corresponding to the type of the actuator, such as a flow rate adjustment range. Besides, a larger reaction may lead to an accident. In view of these facts, given set values, such as an upper limit value and a lower limit value, may be set for the actuator value (X) (d1) and be applied as a condition to the control.

At S803, the control model C and the parameter (A) thereof are set. The control model C is selected as either of the matrix model C1 and the ratio-constraint model C2. When the ratio-constraint model C2 is selected, the number of internal models (L) is set also. The parameter (A) of the matrix model C1 is equivalent to A of the equation (7), and the same of the ratio-constraint model C2 is equivalent to P, Q, and B of the equation (12). The parameter (A) is estimated by experimental work, and is calculated by the multiple regression analysis or PLS regression analysis, based on actuator values X set variously and a plurality of samples of the optical emission intensity Y monitored by the OES 410 during the actual etching process. When an equation model of a time-serves variation of the value Y at each lot processing and each wafer etching process is created to use the model for compensating the time-serves variation of the value Y, the parameter (A) of the model (Y time-serves variation model Ct) is set in advance. When an algorithm for eliminating the dispersion of the optical ( a kind of variation, similar to fluctuation, white noise, and so on) of the optical emission intensity Y and smoothing the Y time-serves variation is used, a parameter for the algorithm is set in advance.

At S804, before the start of lot-by-lot processing, the etching apparatus 401 is maintained and the etching performance of the equipment is tested and checked through an actual etching process. In this etching process, if the optical emission intensity Y is monitored by the OES 410, the initial value of the optical emission intensity Y at a wavelength as control subject is obtained. At this time, reference value (standard value, representative value, etc.) is set for the actuator value X. The optical emission intensity Y obtained in this manner is the initial value $y_{No*}[0][0]$ of the "non-control optical emission intensity" (d4). The asterisk "*" stands for an actual value.

At S805 to S812 to follow, lot-by-lot processing (processing in lots) is repeated. For lot processing, for example, containers (cassettes, FOUP (Front Opening Unified Pod)) corresponding to a lot consisting of a plurality of wafers are set on the etching apparatus 401. Wafers may be inserted (from the container) directly in the etching apparatus 401, or may be manually placed therein, or may be automatically placed (laid, collected, etc.) by an automatic transfer apparatus.

In processing one lot, at S806 to S811, an etching process on each of wafers in the lot (wafer-by-wafer etching process) is repeated consecutively and automatically. A case is assumed where the #jj-th wafer (W#jj) in the #ii lot is subjected to the etching process, and the details of a calculation in this case will be described. #kk denotes the count of wafers having been etched following S804. Before the start of the current wafer etching process, the actuator value X (the X controlled volume (ΔX) (d7) for the X set value (d1)) is calculated at S807. The control model C is the relation model defining the relation of the difference or error (d5) between the "non-control optical emission intensity" (d4) and the Y target value (d3), i.e., the Y target controlled volume (d6) to the actuator value X (X controlled volume (d7)). To calculate the actuator value X (ΔX), a "non-control optical emission intensity" $y_{No}[\#ii][\#jj]$ for the current etching process is required. This intensity value may be given as the "non-control optical emission intensity" (d4) calculated at S810 in the control flow of the previous wafer etching process, but may be given as a value calculated using the "non-control optical emission intensity" time-serves variation model (Ct). The following equation (14) is an example of the time-serves variation model (Ct).

[Equation 14]

$$y_{No}[\#ii][\#jj]=\text{Drift}_{lot}\times\#kk+\text{Drift}_{wafer}\times(\#jj-1)+y^*_{No}[0][0] \quad (14)$$

where $\text{Drift}_{lot}$ denotes a time-serves variation gain for every wafer and $\text{Drift}_{wafer}$ denotes a time-serves variation gain for each wafer in a lot.

[Equation 15]

$$y=y^{TGT}-y_{No}[\#ii][\#jj] \quad (15)$$

Substituting the equation (15) in the equation (8) of the matrix model C1 gives the actuator value X(x). Likewise, substituting the equation (15) in the equation (13) of the ratio-constraint model C2 gives the actuator value X(x). This calculated value X is substituted in the equation (7) of the matrix model C1 and in the equation model (12) of the ratio-constraint model C2 to calculate the Y controlled volume, which is determined to be a set controlled value $y^{set}[\#ii][\#jj]$. This set controlled value (corresponding to the Y target controlled volume (d6)) is used at S810.

At S808, the etching apparatus 401 starts the actual etching process, at which the actuator operates according to the actuator value X (X set value (d1)) calculated at S807. Plasma optical emission during this etching process is monitored by the OES 410, and the acquired OES data is stored.

At S809, the optical emission intensity Y (Y actual value (d2)) at the specified subject wavelength is obtained from the OES data (as a value obtained under given time-setting). Calculation of the wavelength, etching step, and the optical emission intensity value Y at S809 is carried out in accordance with the setting made at S801. The obtained optical emission intensity $y^*[\#ii][\#jj]$ is referred to as Y actual value (d2).

At S810, the "non-control optical emission intensity" (d4) necessary for calculating the actuator value X (controlled volume) for the next wafer etching process is calculated. A "non-control optical emission intensity actual value" $y_{No*}[\#ii][\#jj]$ is calculated by the following equation (16).

[Equation 16]

$$y^*_{No}[\#ii][\#jj]=y^*[\#ii][\#jj]-y^{set}[\#ii][\#jj] \quad (16)$$

This "non-control optical emission intensity actual value" may be used directly as the "non-control optical emission intensity" (d4) for calculating the actuator value X for the next wafer etching process. To eliminate noises to smooth time-serves variations, a filter such as an EWMA (Exponentially-Weighted Moving Average) filter may be used.

The "non-control optical emission intensity actual value" for the etching process on the last wafer in the lot is given by the following equation (17).

[Equation 17]

$$y_{No}[\#ii+1][1]=\lambda\times y^*_{No}[\#ii][\#jj]+(1-\lambda)\times y_{No}[\#ii][\#jj] \quad (17)$$

The etching process on other wafers in the lot is given by the following equation (18).

[Equation 18]

$$y_{No}[\#ii][\#jj+1]=\lambda\times y^*_{No}[\#ii][\#jj]+(1-\lambda)\times y_{No}[\#ii][\#jj] \quad (18)$$

When the "non-control optical emission intensity" (d4) is calculated based on the time-serves variation model (Ct) of the equation (14), the parameter (A) of the time-serves variation model (Ct) is updated.

The parameter (A) for the etching process on the first wafer in the lot is given by the following equation (19).

[Equation 19]

$$Drift_{ion} = \frac{y^*_{No}[\# \ ii][\# \ jj] - y^*_{No}[0][0]}{\# kk} \quad (19)$$

The parameter (A) for the etching process on other wafers in the lot is given by the following equation (20).

[Equation 20]

$$Drift_{wafer} = \frac{y^*_{No}[\# \ ii][\# \ jj] - Drift_{ion} \times \# \ kk - y^*_{No}[0][0]}{\# jj - 1} \quad (20)$$

What has been described above is the contents of the Run-to-Run control based on the matrix model C1 and the ratio-constraint model C2 according to the first embodiment.

<Manufacturing Method for the Semiconductor Device>

Figure 1:
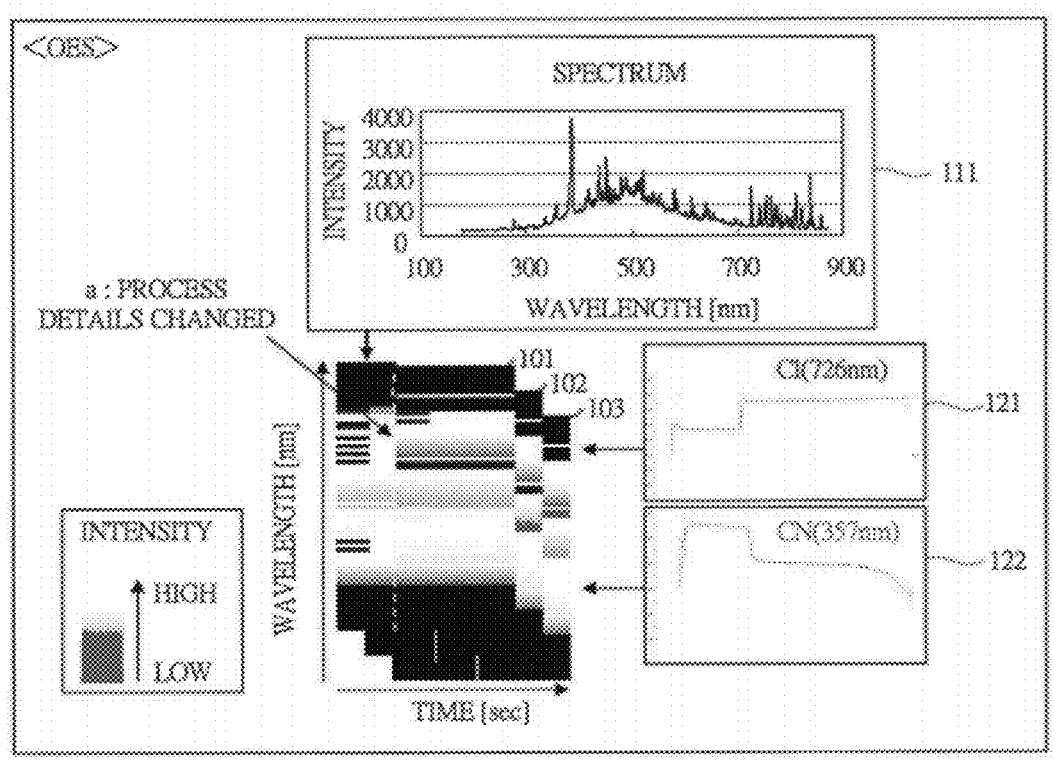
FIG. 1 is an explanatory diagram showing contents of OES data, especially a relation between an optical emission spectrum and a waveform, according to a premised technique.
Figure 2:
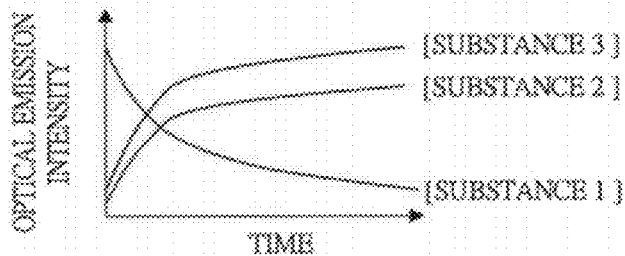
FIG. 2 is an explanatory diagram showing a correlation between a chemical reaction and a waveform (optical emission intensity), according to the premised technique.
Figure 3:
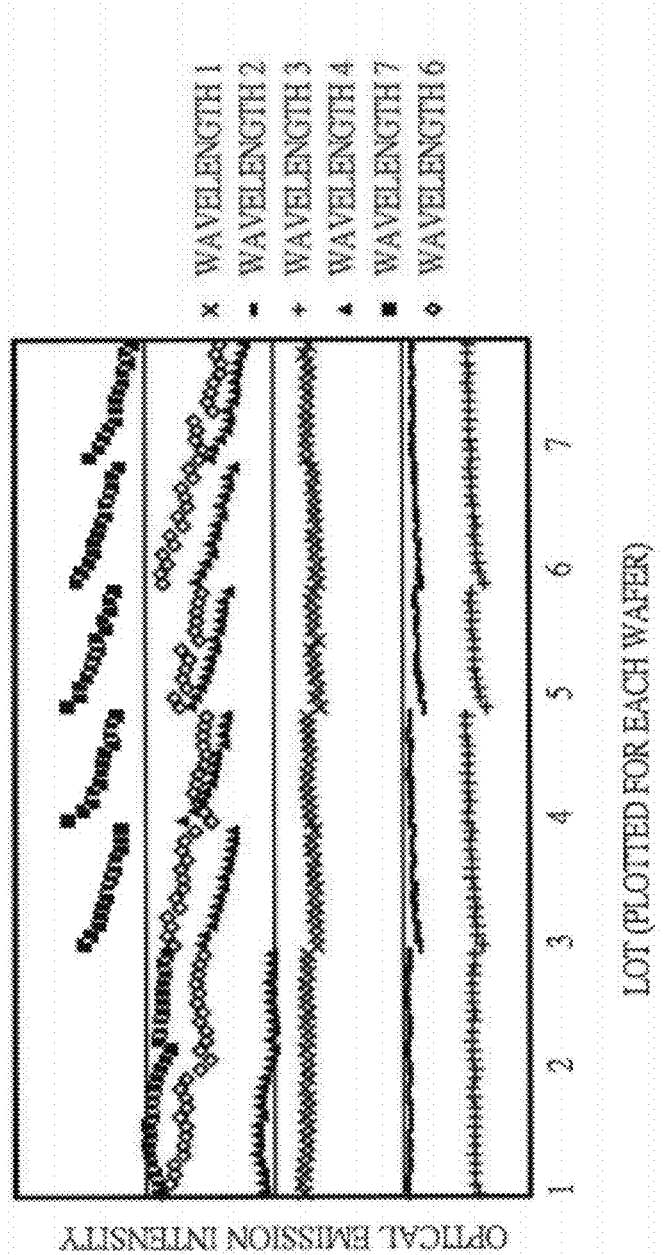
FIG. 3 is a graph showing variations of optical emission intensities at individual wavelengths for each etching process of lots and wafers, according to the premised technique.

The following is the description of a manufacturing method for a semiconductor device of the present embodiment achieved by using the etching apparatus 401 and the system 400 for the same according to the present embodiment. In the present embodiment, etching processes on lots and wafers according to a known manufacturing method for a semiconductor device are carried out by the etching apparatus 401 and the system 400 for the same. In a production line, a control system for the same, etc., a plurality of lots having been subjected to a pre-etching photolithography process, etc., are set on the etching apparatus 401. For example, the lots are automatically transferred from the production line to the etching apparatus 401 according to a given schedule, using an automatic transfer apparatus, etc., arranged and processed on the etching apparatus 401, and are collected to the production line after the etching process is over. The etching apparatus 401 repeatedly carries out the etching process consecutively lot by lot and wafer by wafer under control by the apparatus controller 409 (control over the operation of each actuator, etc.). As shown in FIG. 4, each of wafers 405 is etched consecutively in the chamber 402. During the repetition of the etching process, the Run-to-Run control based on the basic setting is carried out automatically by the computer 411 (control function) described above. As a result, for example, time-serves variations of optical emission intensities Y at lots and wafers, as shown in FIG. 3, are compensated (stabilized).

(Second Embodiment)

The etching apparatus 401, etc., of a second embodiment will be described with reference to FIGS. 9 to 15. In the second embodiment, the use of an integrated model (C3) created by integrating the two models (C1, C2) of the first embodiment will be described. Configurations of the second embodiment and other embodiments to follow include additional functional elements, etc., in addition to the basic configuration of the first embodiment.

Figure 9:
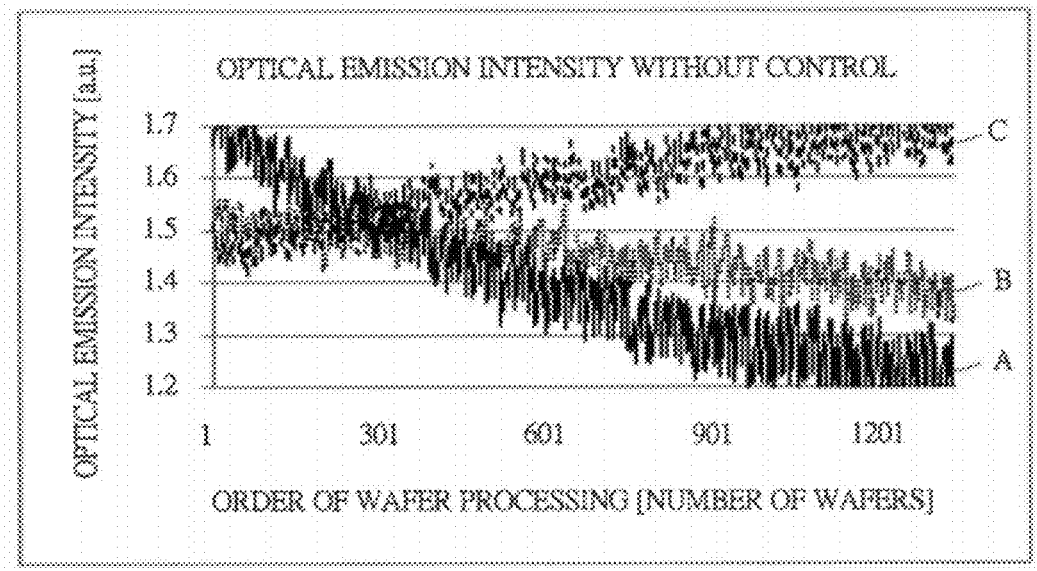
FIG. 9 depicts an example (1) of a result of the Run-to-Run control (optical emission intensity value)
Figure 10:
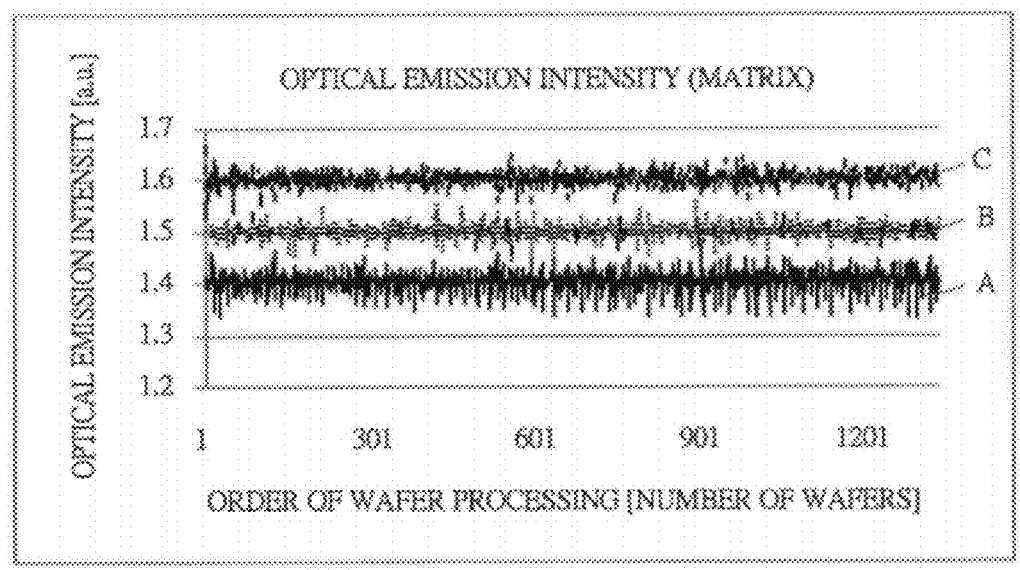
FIG. 10 depicts an example (2) of a result of the Run-to-Run control (optical emission intensity value)
Figure 11:
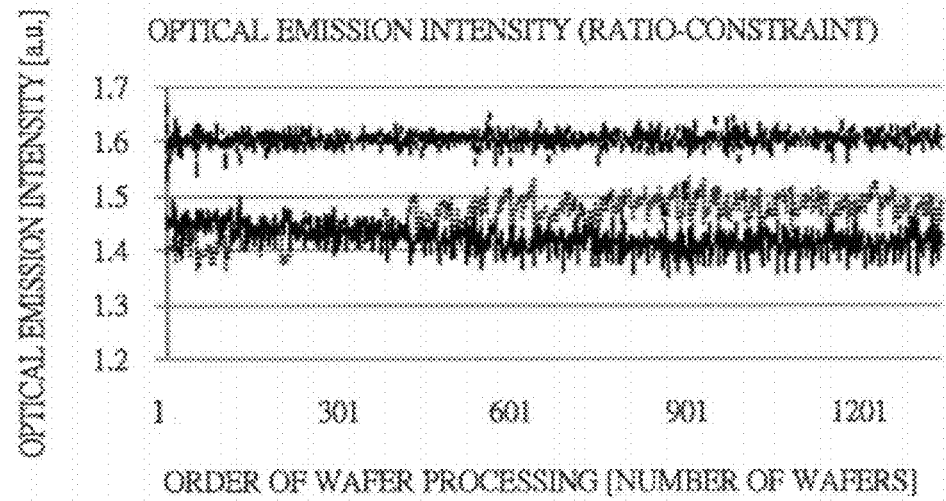
FIG. 11 depicts an example (3) of a result of the Run-to-Run control (optical emission intensity value)
Figure 12:
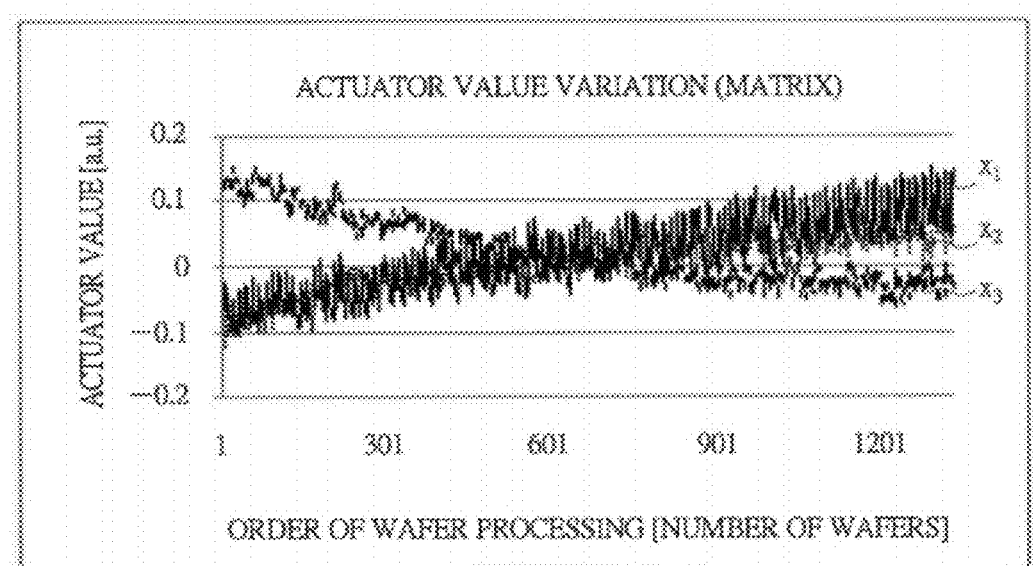
FIG. 12 depicts an example (1) of a result of the Run-to-Run control (actuator value)

FIGS. 9 to 13 depict examples of results of the Run-to-Run control based on the matrix model C1 and the ratio-constraint model C2 for a case of three-wavelength (three-sensor)/three-actuator control. FIGS. 9 to 11 are graphs of time-serves variations of optical emission intensities Y (actual value for each wafer). FIG. 9 is a graph of optical emission intensities under no control, FIG. 10 is a graph of optical emission intensities under control based on the matrix model C1, and FIG. 11 is a graph of optical emission intensities under control based on the ratio-constraint model C2. An optical emission intensity Y at a wavelength A (target value 1.4) is indicated by a solid line, an optical emission intensity Y at a wavelength B (target value 1.5) is indicated by a dotted line, and an optical emission intensity Y at a wavelength C (target value 1.6) is indicated by a broken line. FIGS. 12 and 13 are graphs of variations of actuator values X. FIG. 12 is a graph of variations of actuator values X under control based on the matrix model and FIG. 13 is a graph of variations of actuator values X under control based on the ratio-constraint model C2. A first actuator value ($x_1$) is indicated by a solid line, a second actuator value ($x_2$) is indicated by a dotted line, and a third actuator value ($x_3$) is indicated by a broken line. The horizontal axis represents the processing order (number) of wafers in FIGS. 9 to 13, and the vertical axis represents optical emission intensity Y [a.u.] in FIGS. 9 to 11 and represents actuator value X [a.u.] in FIGS. 12 and 13. The vertical axis is graduated with numerical values. These numerical values, however, are put to merely indicate graduations at the equal interval, and the absolute values indicated by the numerical values have nothing to do with the actual etching process.

The graph of FIG. 9 of optical emission intensities under no control indicates, for example, that the optical emission intensity at the wavelength A falls sharply from 1.7 to 1.2. The optical emission intensities Y under control based on the matrix model C1 of FIG. 10 show a dispersion of a white noise pattern at the wavelengths A, B, and C, but indicate that average optical emission intensities match the target values. The optical emission intensities Y under control based on the ratio-constraint model C2 of FIG. 11 show a slight change between the wavelengths A and B. This change results because that according to the ratio-constraint model C2, the actuator value X cannot be so calculated that the controlled volume matches the target value. In FIG. 11, however, the variations of the optical emission intensities Y are reduced and are closer to the target value than in the case of no control.

The variations of actuator values X under control based on the matrix model C1 of FIG. 12 show that, for example, the first actuator value ($x_1$) increases sharply from −0.1 to 0.1. The variations of actuator values X under control based on the ratio-constraint model C2 of FIG. 13 show that the values ($x_1$, $x_2$, $x_3$) change within a range of ±0.3.

FIG. 14 depicts the contents of the above graphs summarized in a table. According to the matrix model C1, a variation of the actuator value X is large (which poses a risk of rank deficiency), but control over the optical emission intensity Y (optical emission control) is fine. According to the ratio-constraint model C2, a variation of the actuator value X is small (which makes setting of the actuator value X easier), but optical emission control is rather inferior. This means that when the control is carried out based on either of the control models C1 and C2, setting of the actuator value X becomes troublesome or the optical emission intensity Y becomes out of its required range to make control precision insufficient, depending on the precision of a required etching process result or on the limitation to (allowable range) actuator setting.

To solve the above problem, according to the second embodiment, a manipulated volume for the actuator value X is kept within a narrow range as a variation of the optical emission intensity Y is reduced (control target). In view of the characteristics of variations of the actuator value X and optical emission intensity Y under the Run-to-Run control based on the matrix model C1 and the ratio-constraint model C2, two control models (C1, C2) are integrated. This matrix plus ratio-constraint integrated control model is determined as the integrated model C3.

<Integrated Model>

An outline of the integration of control models will be described with reference to FIG. 15. FIG. 15A depicts an effect of model integration on a time-serves variation of the actuator value X. In a graph (a1) of a time-serves variation of the actuator value X under the Run-to-Run control based on the matrix model C1, an adjustment range for the value X denoted by a is so large that the value X cannot be set. In a graph (a2) of a time-serves variation of the actuator value X under the Run-to-Run control based on the ratio-constraint model C2, the adjustment range for the value X is small. When the actuator value X is calculated, a controlled volume for the optical emission intensity Y is distributed among different models, and the actuator value X is calculated based on each model. In this manner, an adjusted/manipulated volume for the actuator value X can be distributed. As a result, as shown in a graph (a3) of a time-serves variation of the actuator value X under the Run-to-Run control based on the integrated model C3, the adjustment range for the value X denoted by c becomes smaller, which allows setting of the actuator value X on the etching apparatus 401 (actuator).

FIG. 15B depicts an effect of model integration on a time-serves variation of the optical emission intensity Y. In a graph (b1) of a time-serves variation of the optical emission intensity Y under the Run-to-Run control based on the matrix model C1, the value Y shows a small change. In a graph (b2) of a time-serves variation of the optical emission intensity Y under the Run-to-Run control based on the ratio-constraint model C2, the value Y shows a large change as shown in b. Because a controlled volume for the optical emission intensity Y is distributed among each model at the calculation of the actuator value X, a variation of optical emission intensity Y becomes smaller in correspondence to a portion of the controlled volume distributed to the matrix model C1. As a result, in a graph (b3) of a time-serves variation of the optical emission intensity Y under the Run-to-Run control based on the integrated model C3, the value Y shows a small change, as shown in c, which indicates an improvement in the accuracy and precision of the etching process result.

The integrated model C3 is defined by the following equations (21) and (22).

[Equation 21]

$$y^T = (D_{MAT} + D_{RC})y^T \\ = D_{MAT}y^T + D_{RC}y^T \\ = y_{MAT}^T + y_{RC}^T \\ = x^{MAT^T}A^T + x^{RC^T}P(P^TP)^{-1}BQ^T \quad (21)$$

[Equation 22]

$$D_{MAT} + D_{RC} = 1 \quad (22)$$

Where D denotes a scalar coefficient of partition, an affix MAT denotes a matrix control model component, and RC denotes a ratio-constraint control model component. The first members on the right hand side on the second, third, and fourth rows of the equation 21 are equal to each other, and the second members of the same are also equal to each other. The equation (22) represents a constraint condition for controlled volume distribution.

The coefficient of partition may be defined as a vector quantity. In such a case, the first and second rows of the equation (21) and the equation (22) are written into the following equations (23) and (24).

[Equation 23]

$$y^T = \text{diag}((D_{MAT} + D_{RC})y^T)^T \\ = \text{diag}(D_{MAT}y^T)^T + \text{diag}(D_{RC}y^T)^T \quad (23)$$

[Equation 24]

$$D_{MAT} + D_{RC} = 1 \quad (24)$$

where D denotes a partition coefficient vector with the number of optical emission wavelengths N as the number of elements. This is the vector that weights the optical emission intensity Y, and can be expressed by taking the diagonal components of a matrix that is the product of a vertical vector D and a horizontal vector $y^T$. diag(M) denotes an operation of transforming the diagonal components of a square matrix M into a vertical vector, and is different from an operation of rows of scalar members or operation using vector arguments.

<Control Based on Integrated Model>

The contents of the Run-to-Run control based on the integrated model C3 will be described. The flow of this Run-to-Run control is the same as the flow shown in FIG. 8, except processes at S803 and S807.

In the process of specifying the control model C (C3) and the parameter (A) at S803, the above coefficients of partition $D_{MAT}$ and $D_{RC}$ or partition coefficient vectors $D_{MAT}$ and $D_{RC}$ are set, in addition to setting of other items.

In the process of calculating the actuator value X at S807, the actuator value X is calculated by a different method. The value X is calculated based on the control model C (C3) with a difference or error (d5) between the Y target value (d3) and the non-control optical emission intensity (d4) as the Y target controlled volume (d6). First, the Y target controlled volume y is divided into a first controlled volume based on the matrix model C1 and a second controlled volume based on the ratio-constraint model C2. These divided controlled volumes are expressed as the following equations (25) and (26).

[Equation 25]

$$y^T_{MAT} = D_{MAT}y^T \quad (25)$$

[Equation 26]

$$y_{RC}^T = D_{RC}y^T \quad (26)$$

Different actuator values X (a first value X and a second value X) are then calculated based on different models (C1, C2), respectively, and the calculated actuator values X are added up to produce the calculated actuator value X. This process is expressed as the flowing equations (27), (28), and (29).

[Equation 27]

$$x^{MAT^T} = y_{MAT}^T A^{-1} \quad (27)$$

[Equation 28]

$$x^{RC^T} = y_{RC}^T Q(Q^TQ)^{-1}B^{-1}P^T \quad (28)$$

[Equation 29]

$$x = x^{MAT} + x^{RC} \quad (29)$$

For a calculation using partition coefficient vectors, the equation (25) is modified into $y_{MAT}^T = \text{diag}(D_{MAT}y^T)$ and the equation (26) is modified into $y_{RC}^T = \text{diag}(D_{RC}y^T)$. The set controlled volume $y^{set}[\#ii][\#jj]$ is calculated by the equation (21) or the equation (23). Now, what has been describe above is the contents of the Run-to-Run control based on the integrated model C3.

<Rank Deficiency>

The matrix model C1 raises another concern. As shown in FIG. 8, calculation of the actuator value X for the matrix model C1 accompanies a risk of unsolvability due to rank deficiency. Using the parameter (A) in experimental work results in the dispersion of the Y actual value. As a result, the parameter (A) of the matrix model C1 is calculated without causing rank deficiency but the actuator value X is calculated at an abnormal value. Because the condition of rank deficiency is the case in which a matrix |A| is zero (0), whether the control is impossible or not is judged based on whether the matrix |A| is close to 0 or not. That is, this process is based on the following equation (30).

[Equation 30]

$$\text{abs}|A| < \Delta_{det} \qquad (30)$$

where $\Delta_{det}$ denotes a control impossibility judgment upper limit value, and abs denotes an operation of taking the absolute value of A.

Another method may be employed in such a way that the actuator value X is calculated using the equation (8) to judge whether the control is impossible or not based on the calculated actuator value X. Now suppose the parameter (A) of the matrix model C1 expressed as the following equation (31) is obtained through experimental work.

[Equation 31]

$$A = \begin{bmatrix} 1.000 & 2.000 \\ 1.001 & 2.001 \end{bmatrix} \qquad (31)$$

If $(y^{TGT})^T = [1\ 2]$ is set, the equation (8) gives the actuator value X of $X^T = [1999\ -999]$. In this manner, a controlled volume for the optical emission intensity Y is set for the parameter (A) of the matrix model C1 obtained through experimental work to calculate the actuator value X. Based on the calculated actuator value X, a judgment can be made on whether it is all right to carry out the control using the matrix model C1. For example, if a standard actuator value X is (within a range of) −10 or more to +10 or less, it may be judged that the control becomes impossible when an actuator value X is (a threefold range of) −30 or more to +30 or less.

In a case where the actuator value X becomes excessively large, the absolute value of elements of an inverse matrix becomes large, therefore, a judgment may be made based on the value of the inverse matrix. Another method may also be employed, according to which the matrix of the parameter A is subjected to fundamental transformation by which every value on any given one line and one column is turned into 1 and whether every value on other lines or columns also turns into 1 is judged. In this manner, a wavelength or actuator that causes rank deficiency can be found.

<Model Transforming Method>

Even if the parameter A of the matrix model C1 causes rank deficiency or the matrix |A| is close to 0, if the parameter A is transformed into the parameter of the ratio-constraint model C2, the parameter A can be used for the Run-to-Run control. This is effective when the PLS regression analysis is unusable in experimental work. Examples of the transformation methods will be described for three combinations of the number of wavelengths (N), the number of actuators (M), and the number of internal models (L).

The basic concept of the transformation method is to match the parameter A of the model C1 to P $(P^T P)^{-1} B Q^T$ using $A^T = P_a Q^T$, where B represents a unit matrix. Let $P_a$ be a matrix composed of linearly independent columns of $A^T$ so that $Q^T$ is determined by $A^T = P_a Q^T$. Setting $P = P_a L$ yields $L = ((P_a^T P_a)^{-1})^T$, as a result, $P = P_a ((P_a^T P_a)^{-1})^T$ is given. When columns of $A^T$ are linearly dependent, P may be determined by setting $Q_a^T$ for the parameter A of the model C1, such as $A^T = P Q_a^T$.

The transformation in a first example (N=2, M=2, L=1) will be described. It is assumed that the parameter A of the matrix model C1 is expressed as the following equation (32), where the matrix is divided into vectors in accordance with the ratio between a value in the first column and a value in the second column after transposition.

[Equation 32]

$$A^T = \begin{bmatrix} a & \alpha a \\ b & \alpha b \end{bmatrix} \qquad (32)$$

$$= \begin{bmatrix} a \\ b \end{bmatrix} [1\ \alpha]$$

B, Q, and P are the parameter (A) of the ratio-constraint model C2 and are set by the following equations (33), (34), and (35).

[Equation 33]

$$B = [1] \qquad (33)$$

[Equation 34]

$$Q^T = [1\ \alpha] \qquad (34)$$

[Equation 35]

$$P^T = \begin{bmatrix} \dfrac{a}{a^2 + b^2} & \dfrac{b}{a^2 + b^2} \end{bmatrix} \qquad (35)$$

The transformation in a second example (N=3, M=3, L=1) will be described. In this case, the parameter A of the matrix model C1 is transformed into the product of vectors, which is expressed as the following equation (36).

[Equation 36]

$$A^T = \begin{bmatrix} a & \alpha a & \chi a \\ b & \alpha b & \chi b \\ c & \alpha c & \chi c \end{bmatrix} \qquad (36)$$

$$= \begin{bmatrix} a \\ b \\ c \end{bmatrix} [1\ \alpha\ \chi]$$

B, Q, and P are the parameter (A) of the ratio-constraint model C2 and are set by the following equations (37), (38), and (39)

[Equation 37]

$$B = [1] \qquad (37)$$

[Equation 38]

$$Q^T = [1\ \alpha\ \chi] \qquad (38)$$

-continued

[Equation 39]
$$P^T = \begin{bmatrix} \dfrac{a}{a^2+b^2+c^2} & \dfrac{b}{a^2+b^2+c^2} & \dfrac{c}{a^2+b^2+c^2} \end{bmatrix} \quad (39)$$

The transformation in a third example (N=3, M=3, L=2) will be described. In this case, the parameter A of the matrix model C1 is expressed as the product of non-square matrices, which is given as the following equation (40). Linearly independent columns of the matrix $A^T$ remain on the left matrix on the right hand side of the equation to make up three rows and two columns. The right matrix is set temporarily.

[Equation 40]
$$\begin{aligned} A^T &= \begin{bmatrix} a & \alpha a & g \\ b & \alpha b & h \\ c & \alpha c & i \end{bmatrix} \\ &= \begin{bmatrix} a & g \\ b & h \\ c & i \end{bmatrix} \begin{bmatrix} o & p & q \\ s & t & u \end{bmatrix} \\ &= P_a Q^T \end{aligned} \quad (40)$$

$Q^T$ is given as the following equation (41) by solving the equation (40).

[Equation 41]
$$Q^T = \begin{bmatrix} 1 & \alpha & 0 \\ 0 & 0 & 1 \end{bmatrix} \quad (41)$$

$Q^T$ is also determined by numerical operation from $Q^T = (P_a{}^T P_a)^{-1} P_a{}^T A^T$, where P is given by $P = P_a((P_a{}^T P_a)^{-1})^T$.

It is also possible to determine the parameter (A) of the ratio-constraint model C2 from the matrix model C1, using the PLS regression analysis. First, input to the matrix model C1 is set appropriately to calculate output from the matrix model C1, thereby make a number of samples. By executing the PLS regression analysis using the samples, B, Q, and P which are the parameter of the ratio-constraint model C2 are determined. This process does not require additional experimental work.

As described above, the second embodiment (control using the integrated model C3) achieves preferable etching control.

(Third Embodiment)

The etching apparatus 401, etc., according to a third embodiment will be described with reference to FIGS. 16 to 20. The third embodiment relates to a method of experimental work for determining the matrix model C1, the ratio-constraint model C2, and their parameters (A). The method of experimental work of the third embodiment is based on a known design of experiment (DOE). Specifically, each actuator value X is set to several levels of the actuator value X, and the etching process is carried out using a combination of levels of the actuator value X, by which a variation ($\Delta Y$) of the optical emission intensity Y to a manipulated volume ($\Delta X$) for the actuator value X is determined. In brief, the first several wafers in a lot are etched, and the following wafers are etched with manipulated volumes for the value X corresponding to arrayed levels determined by the design of experiments, then the value Y is monitored by the OES. From the etching result of the first several wafers, the parameter (A) of the time-serves variation model (Ct) is estimated, and from the etching result of the following wafers, a (sample) variation of the value Y corresponding to the adjusted/manipulated volume for the actuator value X is determined. Then, the parameter (A) of the control model is calculated using the determined variation of the value Y.

Advantages of the third embodiment are the experimental work for determining the above two models (C1, C2), compensating a time-serves variation of the Y value in the etching process and determining a Y actual value, i.e., sample value, and reducing the number of times of etching processes and of wafers to reduce the number of the experimental work in high-volume manufacturing.

<Experimental Work -Process Flow->

An experimental work process will be described with reference to a flowchart of FIG. 16. In FIG. 16, steps framed with thick lines (S1201, etc.) describe manual (user) setting processes and other steps describe processes by the etching apparatus 401 or the computer 411, etc., incorporated therein. According to the configuration of FIG. 5 described above, the experimental work function 521 is included in the OES data analyzing system 433. In the present embodiment, however, the function (521) is included in the etching apparatus 401, in which the computer 411 executes calculations related to the experimental work function 521. It may be also applicable that the etching apparatus 401 executes the etching process and the OES data analyzing system 433 executes settings and calculations.

At S1201, an in-lot time-serves variation model (denoted by Ct1) is set and the number of etching processes (number of wafers) (denoted by w2) carried out using an actuator representative value (denoted by Xr) is set. The in-lot time-serves variation model (Ct1) expresses a variation of the optical emission intensity Y caused by repeatedly and consecutively etching a plurality of wafers in a lot one by one. An example of the in-lot time-serves variation model (Ct1) is given by eliminating one member from the right side of the equation (14). The actuator representative value (Xr) is the actuator value X to which no manipulated volume (controlled volume) (d7) is added, meaning "non-control actuator (value) setting".

The necessity of the in-lot time-serves variation model (Ct1) in the experimental work will be described with reference to FIG. 17. In the graph, the horizontal axis represents the order (number) of processing of wafers in the experimental work and the vertical axis represents the optical emission intensity Y. Black circles represent the optical emission intensity Y in the etching process using the actuator representative value (Xr), and white circles represent the optical emission intensity Y in the etching process using a combination of levels of the actuator value. It is assumed that the optical emission intensity Y increases at a fixed ratio in an increasing order of etching processes. It is necessary to quantify a controlled volume (variation $\Delta Y$ of the optical emission intensity Y) resulting from a combination of levels of the actuator value and a variation $\Delta Y$ of the optical emission intensity Y resulting from the repetition of etching processes. To that end, an estimation line (a) representing a tendency of time-serves variation is determined based on the optical emission intensity Y in the etching process using the actuator representative value (Xr) (black circles). Then, a difference between the optical emission intensity Y resulting in the etching process using a combination of levels of the actuator value (white circles) and the estimation line (a) is taken. This difference is equivalent to the variation $\Delta Y$ of the optical emission intensity Y caused by a combination of levels of the actuator value, that is, a controlled volume. For example, a difference between the optical emission intensity Y resulting from a combination of levels of the actuator value, which is denoted by b, and the estimation line (a) is a controlled volume denoted by c. Thus, the estimation line (a) is the line that represents a change in the non-control optical emission intensity at each etching process, a line of which is obtained by determining the parameter (A) based on a Y actual value resulting from the actuator representative value (Xr) with the in-lot time-serves variation model (Ct1) assumed to be a straight line. In this manner, to compensate a variation of the optical emission intensity Y caused by the repetition of etching processes and obtain a controlled value achieved by adjustment of the actuator value X, the etching process using the in-lot time-serves variation model (Ct1) and the actuator representative value (Xr) is required.

The in-lot time-serves variation model (Ct1) may not be a straight line but may be a non-linear line expressed by a quadratic equation. When the parameter (A) is determined by the multiple regression analysis, the number of etching processes using the actuator value (Xr) must be more than or equal to the number of parameters. If one among a combination of levels of the actuator value is equivalent to the actuator representative value (Xr), the number of etching processes may be reduced by one. If no time-serves variation occurs in the lot, one round of the etching process using the actuator representative value (Xr) is enough. In this case, a difference between the optical emission intensity Y resulting from the actuator-representative-value etching process and the optical emission intensity Y resulting from each combination of levels of the actuator value is equivalent to a controlled value.

At S1202, an actuator used for the control is specified, and the number of levels and the value X at each level are set. This actuator is selected as an actuator of which the adjustment is expected to cause a change in the optical emission intensity Y. The number of levels is determined in such a way that two stages of value setting results in two levels and three stages of value setting results in three levels. The actuator value X at each level is set based on a physically allowable range or a range allowed for achieving given etching performance. For example, when a set allowable range for the actuator value X is −15 to +15 and three levels of the actuator value are set, the actuator value at a first level may be determined to be −10, the same at a second level may be determined to be 0, and the same at a third level is determined to be +10.

Next, at S1203, information on the optical emission intensity Y is set. The information includes a subject wavelength, an etching step, a Y totaling method, etc. This is the same process carried out at S801 of FIG. 8, except that setting the Y target value (d3) is unnecessary because the purpose of the experimental work is to determine the variation ΔY of the optical emission intensity Y to the manipulated volume for the actuator value X.

While it is assumed that the user makes the above-described setting on the screen 412 connected to the computer 411, the set information, however, may be stored in a file or the DB 432 from which the computer 411 reads the set information.

At S1204, the etching apparatus 401 generates a combination of levels of the actuator value based on the above-described set information, and presents a candidate of a combination of levels of the actuator value subjected to the experiment, to the user who carries out the experimental work. The candidate is presented to the user in the form of, for example, information displayed on the screen 412.

Level combination will be described with reference to FIG. 18. FIG. 18 is a diagram of all combinations of levels of actuators expressed as a lattice when three levels of values X are set to each of three actuators. Setting levels of a first actuator value $x_1$ is expressed in the direction of width, setting levels of a second actuator value $x_2$ is expressed in the direction of depth, and setting levels of a third actuator value $x_3$ is expressed in the direction of height. The number of level combinations is calculated as three actuators to the power of three levels, i.e., $3^3=27$. Such a method of setting (arraying) level combinations is referred to as orthogonal array design, by which method the number of level combinations is given as M to the power q, i.e., ($M^q$), where the number of actuators is M and the number of levels is q. Lines of numerals (111, 211, . . . , 122, 222, . . . , 233, 333) appended to the lattice (nodes) of FIG. 18 represent level combinations. At each line of numerals, the first numeral means a level of the first actuator value $x_1$, the second numeral means a level of the second actuator value $x_2$, and the third numeral means a level of the third actuator value $x_3$.

It should be careful about the number of samples for execution of the actual etching process in the experimental work. Calculation of the parameter (A) of the matrix model C1 is based on the relation of a change in the optical emission intensity Y at three wavelengths to three actuators, thus meaning calculation of the parameter (A) separately for each wavelength. The parameter (A), therefore, can be calculated for at least three samples, so that four samples is suffice for calculating the dispersion (standard deviation) of the optical emission intensity Y. If the number of internal models (L) for the ratio-constraint model C2 is 1, the parameter (A) can be calculated with one sample by NIPLAS (Non Linear Interactive PArtial Least Squares).

In FIG. 18, a combination of nine actuator levels (311, etc.) for obtaining nine samples are indicated by encircling them with solid lines, and a combination of four actuator levels (122, etc.) for obtaining four samples are indicated by encircling them with broken lines. It is preferable that each actuator value X be at every level, that is, be set to each of levels 1, 2, 3 when a combination of those three levels is required. 27 level combinations, 9 level combinations, and 4 level combinations are presented to the user, thereby, the user is allowed to select an arbitrary level combination.

At S1205, the user selects a level combination and sets the number of wafers (denoted by w3) for the selected level combination. A level combination of actuator values is set in consideration of, for example, the number of wafers usable, especially of an actuator to be examined in detail. When the dispersion of the optical emission intensity Y by the same actuator value X should be evaluated, instead of evaluating a change in the optical emission intensity Y depending on setting of levels of the actuator value X, for example, the number of wafers for each level combination is set to 2 or 3.

Based on the above-described setting, at S1211 to S1213, the actual etching process is repeated in the number of processes (w2) using the actuator representative value (Xr) and in the number of processes using level combinations. During the actual etching at S1212, the optical emission intensity Y is monitored by the OES 410.

When the repetition of the actual etching process is over, the optical emission intensity Y (Y actual value) at a specified wavelength is obtained from OES data. At this time, the optical emission intensity Y is obtained in accordance with the etching step, Y totaling method, etc., specified at S1203.

At S1222, the parameter (A) of the in-lot time-serves variation model (Ct1) is determined to estimate the non-control optical emission intensity during the etching process based on level combinations. For example, the in-lot time-serves variation model (Ct1) is given by the following equation (42).

[Equation 42]

$$y_{No}[\#jj] = \text{Drift} \times (\#jj-1) + \text{Shift} \tag{42}$$

jj denotes the number of processed wafers counted from the first wafer in repetition of etching process at S1211 to S1213. Drift and Shift denote factors. Now suppose two wafers be etched using the actuator representative value (Xr) and the (sample) optical emission intensity Y resulting from that etching be $y_{Sample*}[1]$ and $y_{Sample*}[2]$, Drift and Shift are determined by the following equations (43, 44).

[Equation 43]

$$\text{Shift} = y^*_{Sample}[1] \tag{43}$$

[Equation 44]

$$\text{Drift} = y^*_{Sample}[2] - \text{Shift} \tag{44}$$

Hence the non-control optical emission intensity during the etching process based on level combinations can be calculated using the equation (42). The in-lot time-serves variation model (Ct1) may be defined as a quadratic equation or an equation higher in degree than the quadratic equation. It may be applicable that the etching process is carried out for the number of times greater than the number of parameters (A) of the in-lot time-serves variation model (Ct1), using the actuator representative value (Xr), and that the parameters (A) are estimated by the multiple regression analysis.

At S1223, the non-control optical emission intensity is subtracted from the optical emission intensity Y to calculate the actual value of the variation ΔY of the optical emission intensity Y to the actuator level combination, that is, the controlled volume. Now let the number of etching processes (w2) using the actuator representative value (Xr) be $N_{no}$, and the following equation (45) gives the actual value of the variation ΔY.

[Equation 45]

$$y^*_{DOE}[\#comb] = y^*_{Sample}[\#comb+N_{No}] - y_{No}[\#comb+N_{No}] \tag{45}$$

Here, the affix DOE indicates that $Y^*_{DOE}$ represents the actual value of the variation ΔY obtained by the experimental work. #comb denotes a level combination number, ranging from 1 to $N_{comb}$. $N_{comb}$ is the number of actuator level combinations.

At S1224, the parameter (A) of each of the control models (C1, C2) is estimated using experimental work actual value samples ($x_{DOE}^*[\#comb], y_{DOE}^*[\#comb]$) by multiple regression analysis and PLS regression analysis. The parameter (A) of the matrix model C1 is determined by the following equations (46), (47), and (48).

[Equation 46]

$$A^T = (X^{*T}_{DOE} X^*_{DOE})^T X^{*T}_{DOE} Y^*_{DOE} \tag{46}$$

[Equation 47]

$$Y^*_{DOE} = \begin{bmatrix} y^*_{DOE}[0]^T \\ y^*_{DOE}[1]^T \\ M \\ y^*_{DOE}[N_{comb}]^T \end{bmatrix} \tag{47}$$

[Equation 48]

$$X^*_{DOE} = \begin{bmatrix} x^*_{DOE}[0]^T \\ x^*_{DOE}[1]^T \\ M \\ x^*_{DOE}[N_{comb}]^T \end{bmatrix} \tag{48}$$

P, Q, and B which are the parameter of the ratio-constraint model C2 are determined by NIPALS, using the following equation (49).

[Equation 49]

$$[P,Q,B] = \text{NIPALS}(X^*_{DOE}, Y^*_{DOE}, L) \tag{49}$$

where NIPALS(X, Y, L) is a function that returns P, Q, and B with arguments of an input sample (X), an output sample (Y), and the number of internal models (L). The number of internal models (L) can be set within a range ($1 \leq L \leq \min\{M, N\}$) with the lower limit of 1 (minimum number of internal models) and the upper limit that is smaller one of the number of actuators M and the number of wavelengths N ($\min\{M, N\}$).

At S1225, the optical emission intensity Y is estimated using actuator level combinations, and errors between the estimated optical emission intensity Y and actual values are totaled. This error e is determined as an error between the actual value of the optical emission intensity Y and the estimated value of the same, using the following equation (50).

[Equation 50]

$$e_{DOE}[\#comb] = y^*_{DOE}[\#comb] - \hat{y}_{DOE}[\#comb] \tag{50}$$

Here, the hat "^" represents an estimated value. An estimated value based on the matrix model C1 is calculated by the following equation (51), and an estimated value based on the ratio-constraint model C2 is calculated by the following equation (52).

[Equation 51]

$$\hat{y}_{DOE}[\#comb]^T = x_{DOE}[\#comb]^T A^T \tag{51}$$

[Equation 52]

$$\hat{y}_{DOE}[\#comb]^T = x^*_{DOE}[\#comb]^T P(P^T P)^{-1} B Q^T \tag{52}$$

An average and a standard deviation are calculated in the above-described error totaling. A larger average means a larger shift of the model-based estimation result to the actual value, and a larger standard deviation means a larger dispersion of errors of model-based estimation. The closer the average and standard deviation are to zero, the higher the precision of model-based estimation is.

Finally at S1226, the parameter (A) of each of the control models (C1, C2) and the error total result are presented to the user. Hence the user is allowed to make a judgment on which control model is more effective for control over the optical emission intensity Y.

When the number of actuators M, the number of wavelengths N, and the number of internal models L are equal to each other, the result of estimation of the parameter (A) of the control model by the PLS regression analysis equation (49) based on NIPALS matches the result of the same by the multiple regression analysis equation (46). Hence $A^T = P(P^T P)^{-1} BQ^T$ and $(A^T)^{-1} = Q(Q^T Q)^{-1} B^{-1} P^T$, which means that the multiple regression analysis can be generalized by the PLS regression analysis. To determine the parameter (A), therefore, only the NIPALS is required.

The control models (C1, C2) can be compared and evaluated by predicting the optical emission intensity Y. Experimental work actual value samples of all actuator level combinations (number of samples $N_{comb}$) are divided into samples for calculating model parameters (number of samples $N_{reg}$) and samples for prediction (number of samples $N_{pred}$), which means $N_{comb}=N_{reg}+N_{pred}$. The parameter (A) is calculated from the equation (49), using samples for calculating model parameters. The calculated parameter (A) is determined to be the "true model parameter". Predicted values for the optical emission intensity Y are calculated from the equation (52), using the samples for prediction, and prediction errors are calculated from the equation (50). The prediction errors are thus totaled to compare and evaluate the control models (C1, C2). At this time, $N_{comb}$ of the equations (47) and (48) are replaced with $N_{reg}$, and #comb of the equations (50) and (52) are interpreted as indexes for the samples for prediction and the estimated values of the same are interpreted as predicted values. What has been described above is an explanation of the process according to the experimental work method.

<Experimental Work -Manhour Reduction->

In high-volume manufacturing at a semiconductor wafer manufacturing factory (fabrication factory), production throughput is important, so that less man-hour in preparatory work other than production of wafers, such as experimental work, is preferable. In other words, a smaller number of etching processes (w2) using the actuator representative value (Xr) and of actuator level combinations are preferable. For this reason, indicating the minimum number of etching processes and of actuator level combinations in the experimental work is usable.

If an in-lot time-serves variation is assumed to be not present, the number of etching process (w2) using the actuator representative value (Xr) is 1, and when the actuator representative value (Xr) is included in a combination of levels of actuator values, the number of etching process (w2) is zero. If an in-lot time-serves variation is assumed to be present, the number of etching process (w2) is 2 on the condition that the variation can be approximated to a straight line. When the actuator representative value (Xr) is included in a combination of levels of actuator values, the number of etching process (w2) is 1. Hence the number of etching process (w2) using the actuator representative value (Xr) is determined to be any one of 0, 1, and 2.

To calculate the parameter of the control model by the PLS regression analysis, the number of samples must be equal to or more than the number of internal models (L). As described before, the number of internal models (L) can be determined to be a value within the range of 1 (minimum number of internal models) to min{M, N} (maximum number of internal models) (an arbitrary value within the range). According to the control of the present embodiment, optical emission intensities Y at a plurality of wavelengths are controlled by actuator values X. Because optical emission occurs at a number of wavelengths depending on substances, the number of actuators (M) is usually determined to be equal to or less than the number of wavelengths (N) (N≥M). For example, when an optical emission intensity Y at one wavelength is controlled by two actuators, how the optical emission intensity Y changes in response to each actuator value X must be evaluated. Thus, the number of samples for determining the parameter (A) of the control model C, that is, the number of actuator level combinations is determined to be the minimum number of internal models (1) or more and the number of actuators (M) or less (1≤the number of samples≤M). However, an estimation error or prediction error for dispersion evaluation must be calculated. For this reason, 1 actuator level for a wafer is added to the number of actuator level combinations.

The minimum number of wafers necessary for the experimental work is given by adding 1 for dispersion evaluation and any one of 0, 1, and 2 for compensating a time-serves variation, to the number equal to or less than the number of actuators (M) used for the control.

The experimental work may lead to a case where the optical emission intensity Y at all wavelengths does not change at any setting of actuators or a case where the optical emission intensity Y does not change at a certain wavelength at every setting of actuators. These cases are shown in FIG. 19.

In FIG. 19, FIG. 19A shows a case of (a) actuator invalidate and FIG. 19B shows a case of (b) wavelength invalidate. In both FIGS. 19A and 19B, two actuators (#1, #2) are plotted in the line direction and two wavelengths (A, B) are plotted in the column direction against graphs with the horizontal axis representing actuator value X and the vertical axis representing optical emission intensity Y. White circles plotted in the graphs represent optical emission intensities Y for individual actuator levels.

In FIG. 19A of the actuator invalidate case, when a second actuator #2 is adjusted to the direction of increase, the optical emission intensity Y increases at a wavelength λ, as indicated by a line c, and decreases at a wavelength B, as indicated by a line d. The optical emission intensity Y, therefore, can be controlled by the second actuator #2. When a first actuator #1 is adjusted to the direction of increase, in contrast, the optical emission intensity Y shows no explicit tendency of increase or decrease, as indicated by a line a representing a change of the optical emission intensity Y at the wavelength A and by a line b representing a change of the optical emission intensity Y at the wavelength B. Because both matrix model C1 and ratio-constraint model C2 define the relation of the optical emission intensity Y at one wavelength to one actuator as a proportional relation, the optical emission intensity Y at these wavelengths cannot be controlled by the first actuator #1.

In FIG. 19B of the wavelength invalidate case, when the first actuator #1 is adjusted at the wavelength A, the optical emission intensity Y decreases, as indicated by a line a, and when the second actuator #2 is adjusted at the wavelength A, the optical emission intensity Y increases, as indicated by a line c. The optical emission intensity Y, therefore, is controllable. In contrast, at the wavelength B, adjustment of the first and second actuators #1 and #2 lead to the optical emission intensity Y indicated by a line b and the optical emission intensity Y indicated by a line d, respectively, which indicate that the optical emission intensity Y, therefore, is uncontrollable.

In such cases, the invalidate actuator is not used for the control or the invalidate wavelength is excluded from subject wavelengths. To make this decision quantitatively, a variation of the optical emission intensity Y to the actuator value X is compared with the size of dispersion of Y actual values in the experimental work. This process will be explained with reference to FIG. 20.

In FIG. 20, FIG. 20A shows a case of (a) no variation and FIG. 20B shows a case of (b) variation present, both cases being expressed as graphs with the horizontal axis representing actuator value X, the vertical axis representing optical emission intensity Y, and Y actual values are plotted on the graphs as white circles. A dashed line a represents an estimated line of the optical emission intensity Y estimated by the multiple regression analysis using the plotted white circles. In the case of (a) no variation, a variation Δ1 of the optical emission intensity Y in an adjustment range for the actuator value X is relatively small in comparison with an error e between a Y actual value and the estimated line a. In the case of (b) variation present, a variation Δ2 of the optical emission intensity Y is relatively large in comparison with the error. This means that when a variation of the optical emission intensity Y is Δ and the standard deviation of errors between Y actual values and the estimated line a is σ, the presence or absence of a variation can be determined based on Δ/σ. When Δ/σ is smaller than a reference value, e.g., 3, it may be judged that the optical emission intensity Y does not change.

There may be a case where optical emission intensities Y at all wavelengths show no change for every actuator. In such a case, the optical emission intensity Y at a wavelength as a control subject cannot be controlled with a specified actuator. This case leads to reselection of an actuator for the control.

When a coefficient matrix as the parameter (A) of the matrix model C1 is rank deficiency or the controlled volume (d7) for the variation ΔX of the value X is out of a given set allowable range, as a result of the control according to the third embodiment, the control is judged to be impossible or improper, which leads to output (notification, display, etc.) of an error message. For example, information, such as an error message, etc., is displayed on the screen 412. When the control is judged to be impossible or improper, the actual etching process by the etching apparatus 401 may be automatically stopped or may be continued.

As described above, the third embodiment (experimental work method for determining the control model C and the parameter (A) thereof) achieves preferable etching control.

(Fourth Embodiment)

The etching apparatus 401, etc., of a fourth embodiment will be described with reference to FIG. 21, etc. The fourth embodiment relates to a control simulation for evaluating the control performance of the Run-to-Run control under which optical emission intensities Y at a plurality of wavelengths are controlled with a plurality of actuator values X, that is, an error between a Y target value and the optical emission intensity Y as a control result (Y actual value), without carrying out the actual etching process.

The basic process of the fourth embodiment is the same as the process depicted in the flowchart of FIG. 8. In the control simulation, however, the Y actual value (value equivalent thereto) must be calculated without carrying out the etching process by the etching apparatus 401. Thus, the control model C for calculating the Y actual value is defined as the "true control model" (Cb) and the control model C for calculating the actuator value X is defined as the control model (Ca) set for control. The control model (Ca) for control is used also for compensating a time-serves variation of the non-control optical emission intensity. This control model (Ca) for control is equivalent to the control model C set and used in actual control (actual Run-to-Run control). Because of a difference between the "true control model" (Cb) and the control model (Ca) for control, the Y actual value deviates from the target value. Based on this fact, the control performance of each control models C can be evaluated. In a similar manner, a control performance difference between control models C due to a difference in their parameters (A) can also be evaluated.

Time-serving variations of the non-control optical emission intensity include "true time-serves variation", which requires calculation of the Y actual value using time-serves variation data of "true non-control optical emission intensity". For compensation of a time-serves variation of the non-control optical emission intensity for the control, the control model (Ca) for control is used and a time-serves variation model, filter, etc., set for control are also used.

<Control Simulation -Process Flow->

A control simulation process by a control simulator 434 will be described with reference to a flowchart of FIG. 21. This process is entirely executed by the control simulator 434 (its computer system).

At S1701, the "true control model" (Cb) and the parameter (A) of the control model C are read. The definition of the control model C includes the number of wavelengths (N) and the number of actuators (M) that are input to the model. The simulation, however, does not need information of wavelengths [nm], actuator types, etc. When the control model C is the matrix model C1, $A^{true}$ is read as a parameter of model C1. When the control model C is the ratio-constraint model C2, $P^{true}$, $Q^{true}$, and $B^{true}$ are read as parameters of the model C2. When the control model C is the integrated model C3, $A^{true}$, $P^{true}$, $Q^{true}$, and $B^{true}$ are read as parameters of the model C3 and distribution factors $D_{MAT}{}^{true}$ and $D_{RC}{}^{true}$ (or vectors $D_{MAT}{}^{true}$ and $D_{RC}{}^{true}$) are also read. For the cases of the models C2 and C3, information of the number of internal models (L) is also read.

At S1702, the control model (Ca) for control and the parameter (A) thereof are read. The parameter (A) is any one or all of A, P, Q, B, $D_{MAT}$ and $D_{RC}$ (or vectors $D_{MAT}$ and $D_{RC}$).

At S1703, a target value $y^{TGT}$ for optical emission intensities Y at a plurality of wavelengths and an initial value $y_{NO}[0][0]$ for the non-control optical emission intensity are read.

At S1704, data of the number of lots and the number of wafers in a lot is read.

At S1705, $y^{true}[\#ii][\#jj]$ is read as time-serves variation data of the "true non-control optical emission intensity". #ii is an index indicative of the order of lots, and #jj is an index indicative of the order of wafers in the lot (order of etching processes). The number of lots and the number of wafers in the lot of these indexes must be identical with the number of lots and the number of wafers indicated by the data read at S1704.

At S1706, set information for compensating a time-serves variation of the non-control optical emission intensity is read. The information includes a parameter for a filter that eliminates noises to smooth the time-serves variation, the time-serves variation model (Ct), and an initial value for the parameter (A) of the time-serves variation model (Ct). If, for example, the filter is provided as an EWMA (Exponentially-Weighted Moving Average) filter, a parameter I is read. If the time-serves variation model (Ct) is defined by the equation (14), initial values for Drift$_{lot}$ and Drift wafer that are parameter (A) of the equation (14) are read.

Processes at S1711 to S1717 to follow are repeated calculations for each lot and each of wafers in the lot. Now let the current process be the #jj-th repetition of in-lot wafer processing (etching process) at the #ii-th repetition of lot processing. Let also total repetitions counted from the start of process repetition be #kk times.

At S1713, the actuator value X is calculated (by the same calculation as the calculation at S807 of FIG. 8). This calculation requires the non-control optical emission intensity $y_{NO}[\#ii][\#jj]$, which is given as the result of calculation of the non-control optical emission intensity at the previous etching process, or, for example, is calculated based on the equation (14) of the time-serves variation model (Ct). A controlled volume is then calculated by the equation (15), and the actuator value $x[\#jj]$ is calculated by the equation (8) when the matrix model C1 is used, by the equation (13) when the ratio-constraint model C2 is used, and by the equations (25) to (29) when the integrated model C3 is used. In the case of integrated model C3, calculation results of $x^{MAT}[\#ii][\#jj]$ and $x^{RC}[\#ii][\#jj]$ are also stored in the memory. A set controlled volume is also calculated by the equation (7) when the matrix model C1 is used, by the equation (12) when the ratio-constraint model C2 is used, and by the equation (21) or (23) when the integrated model C3 is used.

At S1714, a Y actual value is calculated. The Y actual value is the sum of $y^{true}[\#ii][\#jj]$ which is time-serves variation data of "true non-control optical emission intensity", and $y_{model}^{true}$, which is a controlled volume determined by the "true control model" (Cb). Hence the Y actual value is given by the following equation (53).

[Equation 53]

$$y^*[\#=ii][\#jj]y^{true}[\#=ii][\#jj]+y_{model}^{true}[\#ii][\#jj] \quad (53)$$

The controlled volume $y_{model}^{true}$ is calculated by the equation (54) when the matrix model C1 is used, by the equation (55) when the ratio-constraint model C2 is used, and by the equation (56) when the integrated model C3 is used.

[Equation 54]

$$y_{model}^{true}[\#ii][\#jj]=x[\#ii][\#jj]^T A^{true^T} \quad (54)$$

[Equation 55]

$$y_{model}^{true}[\#ii][\#jj]=x[\#ii][\#jj]^T P^{true}(P^{true^T}P^{true})^{-1}B^{true}Q^{true^T} \quad (55)$$

[Equation 56]

$$y_{model}^{true}[\#ii][\#jj]=x_T^{MAT}[\#ii][\#jj]^T A^{true^T}+x^{RC}[\#ii][\#jj]^T P^{true}(P^{true^T}P^{true})^{-1}B^{true}Q^{true^T} \quad (56)$$

At S1715, the non-control optical emission intensity is calculated to compensate the time-serves variation. An actual value for the non-control optical emission intensity is calculated by the equation (16), and when the time-serves variation is compensated using, for example, the EWMA filter, the non-control optical emission intensity is calculated using the equations (17) and (18). When the non-control optical emission intensity is calculated at the calculation of the actuator value X, using the time-serves variation model (Ct), the parameter (A) of the time-serves variation model (Ct) is updated, which is expressed as the equations (19) and (20).

After all repeated calculations are over, at S1721, the results of calculations of the actuator value X and errors between Y actual values and the target value are totaled. Specifically, statistic figures, such as the average, standard deviation, maximum, and minimum of $x[\#ii][\#jj]$ representing the results of calculations of the actuator value X, $y^*[\#ii][\#jj]$ representing Y actual values, and $e[\#ii][\#jj]=y^*[\#ii][\#jj]-y^{TGT}$ representing errors between Y actual values and the target value are calculated by adding up.

Changing the control model (Cb) for control and the parameter (A) thereof and carrying out the control simulation enables comparison and evaluation of control performance for settings.

The simulation by directly reading the "true non-control optical emission intensity" data has been described referring to the flowchart of FIG. 21. The "true non-control optical emission intensity" data is the data obtained by repeating etching processes without actually adjusting the actuator value X. The etching apparatus 401 carrying out actual control (actual etching process) is not able to directly obtain this data, but obtains $y^*[\#ii][\#jj]$, which is the left side of the equation (53). Hence the actuator value X, the control model C, and the parameter (A) at execution of the actual etching process are obtained, and controlled volumes are calculated by the equations (54), (55), and (56) for individual cases of control models C1, C2 and C3. In this manner, $y^{true}[\#ii][\#jj]$ representing time-serves variation date of the "true non-control optical emission intensity" is determined, based on the equation (53).

It is also possible to create time-serves variation date of the "true non-control optical emission intensity" using the time-serves variation model (Ct) and carry out a control simulation.

In such a case, "true time-serves variation model" parameters are read at S1721 in FIG. 21. For example, when the time-serves variation model (Ct) given by the equation (14) is used, $Drift_{lot}^{true}$ and $Drift_{wafer}^{true}$ are read. To give data dispersion, $\sigma^{true}$ is also read as a parameter of the size of dispersion. When the Y actual value is calculated at S1714, $y^{true}[\#ii][\#jj]$ representing the "true non-control optical emission intensity" data is calculated by the following equation (57).

[Equation 57]

$$y^{true}[\#ii][\#jj]=Drift_{lot}^{true}\times\#kk+Drift_{wafer}^{true}\times y_{No}[0][0]+\sigma^{true}\times N(0,1) \quad (57)$$

Here, $N(m, \sigma^2)$ denotes a random number following a normal distribution of an average m and a variance $\sigma^2$.

The above control simulation is described as the simulation in which the Y actual value is calculated based on the "true control model" (Cb). Another form of the control simulation is possible, for example, by determining a controlled volume by the calculated actuator value X and then determining a Y actual value, using a simulator based on physical grounds (process simulator).

As describe above, according to the fourth embodiment (Run-to-Run control simulation), preferable etching control can be achieved.

(Effects)

As described above, the embodiments, the following effects can be obtained: (1) realizing preferable Run-to-Run control using the control model C; (2) realizing the control to bring the Y actual value closer to the Y target value while preventing the abnormality of the value X (limiting the value X within an allowable range); (3) realizing experimental work for determining a preferable parameter (A); and (4) realizing a Run-to-Run control simulation. The effects will be described in details below.

According to the first and second embodiments, adjusted/manipulated volumes for a plurality of actuator values X of the etching apparatus 401 can be calculated within a set allowable range. This prevents an etching process failure, etc. Optical emission intensities Y at a plurality of wavelengths can be brought closer to target values in correspondence to the range.

Controlling optical emission intensities Y at a plurality of wavelengths is equivalent to controlling the volume of a plurality of types of substances involved in etching phenomena in the chamber 402. In other words, by controlling the optical emission intensities Y, the volume of etching of patterns and thin films of various shapes and different compositions produced by chemical reactions between a plurality of substances in the etching process can be controlled. A gas and a bias voltage affecting etching rates in the directions of depth and width are controlled as the actuator values X (etching process conditions, etc.) to obtain a target sectional shape. In a process of etching a thin film of a multilayer structure, an etching rate is controlled with an actuator affecting an etching reaction at each layer so that excessive or insufficient etching at a specific layer can be prevented. When a reaction product increases in an etching process, the reaction product is caused to react with another substance to suppress the production of a specific foreign substance. When production of various substances affects a time-serves variation of an etching rate in etching of a thin film of a complicated composition, such as organic thin film, the volume of production of each substance is fixed to a constant volume to stabilize the etching rate.

Because the OES 410 monitors optical emission during the etching process, etching performance can be estimated without inspecting wafers using a separate inspection apparatus. This allows the actuator value X to be adjusted for each of wafers in a lot etched consecutively and repeatedly, and each lot to be processed repeatedly without waiting for an inspection result. Therefore, the etching process can be stabilized without lowering throughput of the etching apparatus and, for example, highly precise CD dimension can be achieved.

In the experimental work of the third embodiment, the PLS regression analysis is used to determine the parameter (A) of the ratio-constraint model C2. This analysis method allows calculation of a parameter based on, for example, even one set of samples, thus not requiring samples greater in number than parameters, as in the case of the multiple regression analysis. The PLS regression analysis, therefore, enables determining a parameter based on fewer samples, thus reducing experimental man-hour and the number of wafers for experiments.

By utilizing the control simulation for controlling optical emission intensities Y at a plurality of wavelengths with a plurality of actuators according to the fourth embodiment, a change in control performance resulting from a change in a number of parameters included in the control model C can be evaluated easily without carrying out the actual etching process. As a result, a parameter that brings a fine control result is found and applied efficiently. A change in the size of a time-serves variation of the optical emission intensity Y and of dispersion at each etching process is also evaluated in the same manner without carrying out the actual etching process.

The present invention is not limited by the above embodiments, and various modifications of the invention are possible on the condition that modifications are within the scope of the gist of the invention. According the embodiments, for example, the optical emission intensity Y of plasma monitored by the OES 410 is the subject of the control. However, other monitored values as multiple variables, such as the optical film thickness of a wafer under process, an electric field near the wafer, and spectrum detected by infrared, etc., may also be the subject of the control.

INDUSTRIAL APPLICABILITY

The present invention may be applied to a semiconductor manufacturing control system, etc.

explanation of reference numerals
401 Etching apparatus
402 Chamber
403, 406 Electrode
404 Plasma
405 Wafer
407 Exhaust line
408 Gas supply line
409 Apparatus controller
410 OES (Optical Emission Spectroscopy)
411 Computer
412 Screen
413 Flow rate regulator
414 Pressure regulator
415 Power regulator
416 Temperature regulator
421 Window
422 Light
431 Network
432 DB
433 OES data analyzing system
434 Control simulator
501 Run-to-Run control function
501B Run-to-Run control function
502 Each lot/wafer etching process history obtaining function
503 Control model setting function
504 Optical emission wavelength/optical emission intensity target value setting function
505 Control actuator setting function
506 Multiple wavelengths optical emission intensities controlled volume calculating function
507 Actuator value calculating function
508 Actuator value instruction function
509 OES data obtaining function
510 Multiple wavelengths optical emission intensities obtaining function
511 Optical emission intensity time-serves variation obtaining function
521 Experimental work function
522 Actuator level combination setting function
523 Multiple wavelengths optical emission intensities obtaining function
524 Each-control-model model parameter calculating function
525 Optical emission intensity estimation error calculating/evaluating function
526 Optical emission intensity predicting actuator value calculating function
527 True control model setting function
528 Optical emission intensity calculating/estimating function
529 Multiple wavelengths optical emission intensities target value obtaining function
530 Multiple wavelengths optical emission intensities controlled volume calculating function
531 Actuator value calculating/evaluating function
541 True control model setting function
542 Multiple wavelengths optical emission intensities calculating function
543 Non-control optical emission variation obtaining function
544 Control-executed optical emission variation obtaining function
545 Non-control optical emission variation calculating function

The invention claimed is:

1. An etching apparatus comprising an optical emission spectrometry for observing plasma optical emission in a chamber and a plurality of actuators for adjusting the plasma optical emission and carrying out a wafer etching process, the etching apparatus including a control function by which:

when vales of the plurality of actuators are X and values of optical emission intensities at a plurality of wavelengths of the plasma optical emission monitored by the optical emission spectrometry are Y, a relation between set values (d1) for the plurality of actuator values X applied to the etching process and actual values (d2) for the optical emission intensity values Y at the plurality of wavelengths monitored by the optical emission spectrometry during the etching process is defined as a control model based on an algebraical expression expressing a relation between a variation $\Delta X$ of a value X and a variation $\Delta Y$ of a value Y to each value X with the variation $\Delta X$ as input and the variation $\Delta Y$ as output;

the control model and a value of a parameter included in the control model are set in advance; and a target value (d3) for the optical emission intensity values Y at the plurality of wavelengths is set in advance, wherein control of the etching process includes:

a first process step (S1) at which before start of the wafer etching process, values of differences (d5) between the target value (d3) for the value Y and a plurality of non-control optical emission intensity values (d4) are determined to be a target controlled volume (d6) for the value Y, and based on the control model, a controlled volume (d7) for the plurality of actuator values X is calculated from the target controlled volume (d6) for the value Y to apply the controlled volume (d7) for the value X as the set value (d1) to the plurality of actuators;

a second process step (S2) at which the wafer etching process is started, and is ended as the optical emission intensity values Y at the plurality of wavelengths of a spectrum of the plasma optical emission are monitored at given time intervals by the optical emission spectrometry; and a third step (S3) at which the actual values (d2) for the optical emission intensity values Y at the plurality of wavelengths based on data collected by the monitoring or obtained from the data under given time setting are used to calculate the plurality of non-control optical emission intensity values (d4) to be used in a next wafer etching process, based on errors (d8) between the actual values (d2) for the values Y and the target value (d3) and on the controlled volume (d7) for the value X calculated at the first process step, and wherein the process steps 1 to 3 are executed repeatedly in each wafer etching process to adjust the plurality of actuator values X and control the optical emission intensity values Y at the plurality of wavelengths.

2. The etching apparatus according to claim 1, wherein
a relation between values for the control model is defined as a first control model expressed as a matrix equation or simultaneous equation with a variation $\Delta X$ of the value X as input to the equation and a variation $\Delta Y$ of the value Y as output from the equation.

3. The etching apparatus according to claim 1, wherein
a relation between values for the control model is defined as a second control model that defines a relation between the actuators in terms of a variation $\Delta X$ of the value X as a first ratio, that defines a relation between the wavelengths in terms of a variation $\Delta Y$ of the value Y as a second ratio, and that defines a relation between the first ratio and the second ratio as a given proportional relation.

4. The etching apparatus according to claim 1, wherein
a relation between values for the control model is defined as a second control model that defines a relation between the actuators in terms of a variation $\Delta X$ of the value X as a plurality of first ratios, that defines a relation between the wavelengths in terms of a variation $\Delta Y$ of the value Y as a plurality of second ratios, and that defines a relation between each of given first ratios and each of given second ratios corresponding to each other as a given proportional relation.

5. The etching apparatus according to claim 1, wherein
a relation between values for the control model is defined as:

a first partial control model expressed as a matrix equation or simultaneous equation with a variation $\Delta X$ of the value X as input to the equation and a variation $\Delta Y$ of the value Y as output from the equation; and a second partial control model that defines a relation between the actuators in terms of a variation $\Delta X$ of the value X as a first ratio, that defines a relation between the wavelengths in terms of a variation $\Delta Y$ of the value Y as a second ratio, and that defines a relation between the first ratio and the second ratio as a given proportional relation; and a third control model given by integrating the first partial control model and the second partial control model is defined.

6. The etching apparatus according to claim 5, wherein
in calculating a controlled volume (d7) for the value X based on the control model at the first process step, the control function divides a target controlled volume (d6) for the value Y into two controlled volumes, calculates a first controlled volume out of the two controlled volumes as a first target value that is a first controlled volume for a variation $\Delta X$ of a first actuator value X, based on the first partial control model, and a second controlled volume out of the two controlled volumes as a second target value that is a second controlled volume for a variation $\Delta X$ of a second actuator value X, based on the second partial control model, and adds up the calculated first and second controlled volumes to obtain the controlled volume (d7) for the value X.

7. The etching apparatus according to claim 2, wherein
when a coefficient matrix that is a parameter of the first control model is rank deficiency or a controlled volume (d7) for the value X is out of a given set allowable range for the set value (dl), the control function judges the control to be impossible or improper and outputs an error message.

8. The etching apparatus according to claim 2, wherein
when a coefficient matrix that is the parameter of the first control model is rank deficiency or a controlled volume (d7) for the value X is out of a given set allowable range for the set value (d1), the control function transforms the coefficient matrix that is the parameter of the first control model into a parameter of a second control model and applies the second control model to the control, and wherein the second control model defines a relation between the actuators in terms of a variation $\Delta X$ of the value X as a first ratio, a relation between the wavelengths in terms of a variation $\Delta Y$ of the value Y as a second ratio, and a relation between the first ratio and the second ratio as a given proportional relation.

9. The etching apparatus according to claim 1, wherein
the etching process and control thereof are carried out lot by lot on a plurality of lots and wafer by wafer on a plurality of wafers in a lot, and wherein, in calculating the non-control optical emission intensity value Y (d4) at the third process step, the control function defines the non-control optical emission intensity value Y (d4) for number of wafers (w1) in the wafer etching process, as a time-serves variation model for the value Y, calculates a parameter of the time-serves variation model for the value Y, using an error (d8) between data of an actual value (d2) for the value Y and a target value (d3) for the value Y and a controlled volume (d7) for a variation $\Delta X$ of the value X calculated at the first process step, and calculates the non-control optical emission intensity value Y (d4) using the calculated parameter of the time-serves variation model.

10. The etching apparatus according to claim 1, comprising an experimental work function of carrying out an experimental work process for setting a parameter value included in the control model, wherein the experimental work function carries out the experimental work process of:

defining the non-control optical emission intensity value Y (d4) for number of wafers (w1) in the wafer etching process, as a time-serves variation model that is a control model expressing a variation of an actual value (d2) for the value Y for the number of wafers (w1);

setting number of wafers (w2) that are etched consecutively with the plurality of actuator values X set as representative values;

setting each of levels of actuator values X, the levels being set by applying design of experiment to the plurality of actuators, and number of wafers (w3) equivalent to number of set levels;

first, consecutively carrying out the etching process of setting the plurality of actuator values X as the representative values and monitoring optical emission intensity values Y at the plurality of wavelengths by the optical emission spectrometry, on the wafers of which the number is the set number of wafers (w2);

secondly, consecutively carrying out the etching process of monitoring the optical emission intensity values Y at the plurality of wavelengths by the optical emission spectrometry at each value X set at each level of value, on the wafers of which the number is the number of set levels (w3);

obtaining one or more optical emission intensity values Y at the plurality of wavelengths during the consecutive etching process carried out first and calculating a parameter of the time-serves variation model for each wavelength;

obtaining one or more optical emission intensity values Y at the plurality of wavelengths during the consecutive etching process carried out secondly, calculating an optical emission intensity value Y at each wavelength corresponding to number of wafers (w1) during each etching process, based on the time-serves variation model, and subtracting the calculated value Y at each wavelength from the obtained one or more values Y to determine a variation ΔY of the optical emission intensity value Y for a set level of the value X at each wavelength; and calculating a parameter of the control model based on samples of combination of one or more variations ΔX of the set levels of values X and one or more variations ΔY of values Y.

11. The etching apparatus of claim 10, wherein the experimental work function calculates a parameter of the control model by a multiple regression analysis.

12. The etching apparatus of claim 10, wherein the experimental work function calculates a parameter of the control model by a PLS regression analysis.

13. The etching apparatus of claim 10, wherein number of first ratios representing a relation of variations ΔX of the plurality of actuator values X, number of second ratios representing a relation of variations of optical emission intensity values Y at the plurality of wavelengths, and number of proportional relations between the first ratios and the second ratios are the same number (p), and wherein, when smaller one of number of the plurality of actuators (M) and number of the plurality of wavelengths (N) is min{M, N}, the experimental work function sets the number (p) to each of 1 to the min{M, N}, calculates a parameter of the control model by a PLS regression analysis, using the samples of combination, estimates variations ΔY of the values Y from control models of which number corresponds to the set number (p), using variations ΔX of the set values of values X of the samples of combination, to calculate an error between the estimated variations ΔY of the values Y and the variations ΔY of the values Y, and selects the number (p) that minimizes the error to determine the control model for the above setting.

14. The etching apparatus of claim 10, wherein number of first ratios representing a relation of variations ΔX of the plurality of actuator values X, number of second ratios representing a relation of variations of optical emission intensity values Y at the plurality of wavelengths, and number of proportional relations between the first ratios and the second ratios are the same number (p), and wherein, when smaller one of number of the plurality of actuators (M) and number of the plurality of wavelengths (N) is min{M, N}, the experimental work function sets the number (p) to each of 1 to the min{M, N}, calculates a parameter of the control model by a PLS regression analysis, using a first sample constituting part of the samples of combination, predicts variations ΔY of optical emission intensity values Y at the plurality of wavelengths from control models of which number corresponds to the set number (p), using variations ΔX of set values of the plurality of actuator values X of a second sample constituting rest of the samples of combination, to calculate an error between the predicted variations ΔY of the values Y and variations ΔY of the values Y of the second sample, and selects the number (p) that minimizes the error to determine the control model for the above setting.

15. The etching apparatus according to claim 10, wherein necessary number of wafers subjected to the etching process is determined in such a way that number of wafers (w2) consecutively etched with the actuator value X set as the representative value is determined to be 0 or 1 or 2, and that number of wafers (w3) etched as wafers of which the number is equivalent to number of combinations of the set levels of the level-set actuator value X is 1 or more, the number of wafers (w3) being given by adding 1 for dispersion evaluation to a number equal to or less than number of the actuators (M).

16. The etching apparatus according to claim 10, wherein the experimental work function excludes a wavelength from the control subject wavelengths when at the excluded wavelength, no change in a variation ΔY of the value Y is observed at the set levels of values X in control of any actuator or dispersion (noise, variation, deviation) of the value Y is larger than a tendency of an increase or decrease of the value Y at the set levels of values X in samples of combination of one or more variations ΔX of the set levels of values X and one or more variations ΔY of values Y.

17. The etching apparatus of claim 10, wherein the experimental work function excludes an actuator from the control subject actuators when in control of the excluded actuator, no change in a variation ΔY of the value Y is observed at the set levels of values X at any wavelength or dispersion of the value Y is larger than a tendency of an increase or decrease of the value Y at the set levels of values X in samples of combination of one or more variations ΔX of the set levels of the values X and one or more variations ΔY of the values Y.

18. A control simulator that carries out a simulation process of control over a wafer etching process by an etching apparatus, using a computer, the simulation process comprising:

defining a relation between a variation ΔX of the value X and a variation ΔY of the value Y to each value X as a control model based on an algebraical expression with the variation ΔX as input to the expression and the variation Y as output from the expression when vales of a plurality of actuators of the etching apparatus are X and values of optical emission intensities at a plurality of wavelengths of plasma optical emission monitored by an optical emission spectrometry of the etching apparatus are Y;

setting in advance a first model applied to the control and a true second model in a process of setting the control model and a parameter value included therein;

setting in advance a target value for the optical emission intensity values Y at the plurality of wavelengths;

setting in advance time-serves variation data of the optical emission intensity values Y at the plurality of wavelengths for each wafer in a case of no control;

determining an initial value for the estimated value of the value Y in the case of no control to be first value of the time-serves variation data of the values Y for each wafer, for processing first wafer; and carrying out the simulation on wafers of which number is a given number of wafers to be processed, in sequence from the first wafer to last wafer, wherein the simulation process includes:

a first process step of determining a difference between the target value for the value Y and the estimated value of the value Y in the case of no control to be a target controlled volume and calculating a controlled volume for the value X based on the first model, using the parameter of the control model as the set value, to determine the calculated controlled volume to be a set value for the plurality of actuator values X, before start of the wafer etching process;

a second process step of adding one or more variations ΔY of the value Y calculated from the value X based on the true second model, to time-serves variation data of the values Y corresponding to the number of wafers to be processed during the wafer etching process and determining the time-serves variation data including the added variations ΔY to be a monitored value of the value Y given by the optical emission spectrometry; and a third process step of calculating the estimated value of the value Y in the case of no control, using errors between one or more monitored values of the value Y and the target value for the value Y and the controlled volume for the value X calculated at the first process step, and wherein monitored values of the value Y during processing of all wafers that are determined by repeating the first to third process steps are totaled to evaluate an error between the totaled value and the target value for the value Y.

19. The control simulator according to claim 18, wherein the time-serves variation data of the optical emission intensity values Y at the plurality of wavelengths for each wafer in the case of no control represents an optical emission intensity that is determined based on an optical emission intensity monitored by the optical emission spectrometry and on a controlled volume set as a target controlled volume when an actuator value is adjusted in an etching process in which an actuator value for each wafer is adjusted to control an optical emission intensity.

20. The control simulator according to claim 18, wherein the time-serves variation data of the optical emission intensity values Y at the plurality of wavelengths for each wafer in the case of no control is processed by:

defining a time-serves variation model expressing a time-serves variation of the value Y in the case of no control regarding with the number of wafers to be processed;

setting a parameter of the time-serves variation model; and setting the number of wafers to be processed, and wherein the value Y is calculated based on the time-serves variation model or the time-serves variation model with a parameter updated by random number computation, in sequence by staring from first wafer etching process.

21. A manufacturing method for a semiconductor device comprising an etching process by an etching apparatus having an optical emission spectrometry for observing plasma optical emission in a chamber and a plurality of actuators for adjusting the plasma optical emission and carrying out a wafer etching process, wherein the etching process and control thereof are carries out lot by lot on a plurality of lots and wafer by wafer on a plurality of wafers in each lot such that the etching apparatus consecutively processes the plurality of lots and the plurality of wafers in the lots, wherein in the etching process for processing each wafer, when vales of the plurality of actuators are X and values of optical emission intensities at a plurality of wavelengths of the plasma optical emission monitored by the optical emission spectrometry are Y, a relation between set values (d1) for the plurality of actuator values X applied to the etching process and actual values (d2) for the optical emission intensity values Y at the plurality of wavelengths monitored by the optical emission spectrometry during the etching process is defined as a control model based on an algebraical expression expressing a relation between a variation ΔX of a value X and a variation ΔY of a value Y to each value X with the variation ΔX as input and the variation ΔY as output;

the control model and a value of a parameter included in the control model are set in advance; and a target value (d3) for the optical emission intensity values Y at the plurality of wavelengths is set in advance, and wherein control of the etching process includes:

a first process step (S1) at which before start of the wafer etching process, values of differences (d5) between the target value (d3) for the value Y and a plurality of non-control optical emission intensity values (d4) are determined to be a target controlled volume (d6) for the value Y, and based on the control model, a controlled volume (d7) for the plurality of actuator values X is calculated from the target controlled volume (d6) for the value Y to apply the controlled volume (d7) for the value X as the set value (d1) to the plurality of actuators;

a second process step (S2) at which the wafer etching process is started, and is ended as the optical emission intensity values Y at the plurality of wavelengths of a spectrum of the plasma optical emission are monitored at given time intervals by the optical emission spectrometry; and a third process step (S3) at which the actual values (d2) for the optical emission intensity values Y at the plurality of wavelengths based on data collected by the monitoring or obtained from the data under given time setting are used to calculate the plurality of non-control optical emission intensity values (d4) to be used in a next wafer etching process, based on errors (d8) between the actual values (d2) for the values Y and the target value d3 and on the controlled volume (d7) for the value X calculated at the first process step, and wherein the process steps 1 to 3 are executed repeatedly in each wafer etching process to adjust the plurality of actuator values X and control the optical emission intensity values Y at the plurality of wavelengths.

* * * * *